US012598924B2

(12) United States Patent
Charles et al.

(10) Patent No.: US 12,598,924 B2
(45) Date of Patent: Apr. 7, 2026

(54) METHOD FOR PRODUCING A CONTINUOUS NITRIDE LAYER

(71) Applicants:COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin d'Hères (FR); INSTITUT POLYTECHNIQUE DE GRENOBLE, Grenoble (FR)

(72) Inventors: Matthew Charles, Grenoble Cedex (FR); Roy Dagher, Antibes (FR); Guy Feuillet, Grenoble Cedex (FR); Jesus Zuniga Perez, Singapore (SG); Cécile Gourgon, Saint Didier de la Tour (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin d'Hères (FR); INSTITUT POLYTECHNIQUE DE GRENOBLE, Grenoble (FR)

( * ) Notice: Subject to any disclaimer, the term of this patent is extended or adjusted under 35 U.S.C. 154(b) by 0 days.

(21) Appl. No.: 18/910,382

(22) Filed: Oct. 9, 2024

(65) Prior Publication Data

US 2025/0118552 A1 Apr. 10, 2025

(30) Foreign Application Priority Data

Oct. 9, 2023 (FR) ...................................... 2310758

(51) Int. Cl.
*H01L 21/02* (2006.01)
*C30B 25/18* (2006.01)
*C30B 29/40* (2006.01)

(52) U.S. Cl.
CPC ........ *H01L 21/0254* (2013.01); *C30B 25/183* (2013.01); *C30B 29/406* (2013.01);
(Continued)

(58) Field of Classification Search
CPC ................ C30B 25/183; C30B 29/406; H01L 21/02381; H01L 21/02422; H01L 21/02458; H01L 21/0254
See application file for complete search history.

(56) References Cited

U.S. PATENT DOCUMENTS

2022/0251730 A1* 8/2022 Charles ............. H01L 21/02458
2022/0261730 A1 8/2022 Charles et al.
(Continued)

OTHER PUBLICATIONS

Written Opinion on the Patentability of the Invention mailed on Jun. 6, 2024, issued in French Application No. 2310758 (with English translation).
(Continued)

*Primary Examiner* — Hua Qi
(74) *Attorney, Agent, or Firm* — Oblon, McClelland, Maier & Neustadt, L.L.P.

(57) ABSTRACT

The invention relates to a method for obtaining a layer at least partially made of a nitride (N), first comprising the provision of a stack comprising at least one assembly of pads (1000A1-1000B4) extending from a substrate (100). Each pad comprises at least one creep section (220A1-220A5) and one crystalline section (300A1,300A5) surmounting the creep section (200A1-200A5). Then, a crystallite (510A1-510A5) is epitaxially grown on at least some of said pads until coalescence of the crystallites, so as to form a nitride layer (550A). The pads of the assembly are distributed over
(Continued)

(a)

(b)

the substrate, such that the relative arrangement of the pads of the assembly is such that during the epitaxy of the crystallites, the progressive coalescence of the crystallites is always done between, on the one hand, a crystallite or a plurality of coalesced crystallites and, on the other hand, an isolated crystallite.

15 Claims, 15 Drawing Sheets

(52) U.S. Cl.
CPC .. *H01L 21/02381* (2013.01); *H01L 21/02422* (2013.01); *H01L 21/02458* (2013.01)

(56)                    References Cited

U.S. PATENT DOCUMENTS

2022/0359479 A1     11/2022   Feuillet et al.
2023/0030068 A1      2/2023   Nakata

OTHER PUBLICATIONS

Roy Dagher et al. "Pendeo-epitaxy of GaN on SOI nano-pillars: Freestanding and relaxed GaN platelets on silicon with a reduced dislocation density" Journal of Crystal Growth 526 (2019). https://doi.org/10.1016/j.jcrysgro.2019.125235.
European Search Report mailed on Feb. 5, 2025, in EP 24 20 4440.

* cited by examiner 500
400
300
200
100

1000B4
500B4
400B4
300B4
220B4
210
100

110

1000B

1000B1

1000A

1000A4

1000A1
500A1
400A1
300A1
220A1
210
100

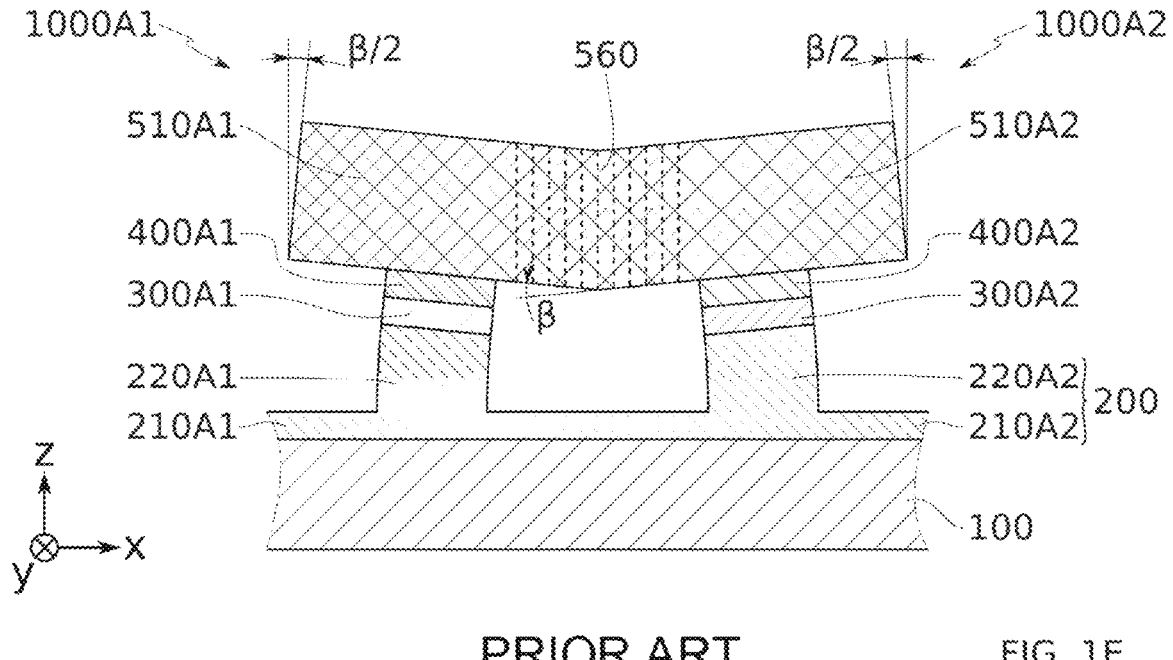
PRIOR ART       FIG. 1E

1000A5
1000A4
1000A3
1000A2
1000A3
1000A2
1000A1
1000A2
1000A3

METHOD FOR PRODUCING A CONTINUOUS NITRIDE LAYER

TECHNICAL FIELD

The present invention relates to the production of continuous layers made of a nitride (N) obtained preferably from at least one from among gallium (Ga), indium (In) and aluminium (Al). The invention has, for example, an application in the field of optoelectronic devices comprising a plurality of light-emitting diodes (LEDs) of a micrometric size, generally called micro-LEDs. In this field, a particularly advantageous use of the invention relates to the production of small screens, generally called micro-screens or also micro-displays.

PRIOR ART

For numerous microelectronic or optoelectronic applications, it is sought to produce nitride layers from at least one from among gallium, indium and aluminium. Specific applications relating, for example, to production of micro-LEDs.

A nitride layer is conventionally obtained by epitaxial growth from a crystalline layer covering a plate.

A major challenge consists of minimising the density of defects in the nitride layer obtained by epitaxy. Indeed, the performances of microelectronic or optoelectronic devices made from these nitride layers are very sensitive to the density of structural defects, such as dislocations.

These dislocations have, as their origin, the mesh parameter difference between the epitaxially grown layer and the substrate, as well as the coalescence of small grains, which are formed at the start of growth; these grains are slightly disoriented against one another, and they are joined by forming structural defects, including dislocations, at the coalescence boundary, which can then pass through the entire epitaxially grown structure.

The most direct way to resolve these problems consists of using substrates of the same nature as the layers which are sought to be epitaxially grown (homo-substrates). However, these substrates are not available commercially, or are still only small, and are very expensive, which does not make it possible to cut substrates of sufficient dimensions there for the industrial applications considered.

The solutions considered to date for industrial applications are therefore mainly based on using hetero-substrates, combined with so-called "epitaxial lateral overgrowth" (ELOG) methods. This method, based on using a mask to block the dislocations, makes it possible to reduce the density of the latter. However, these dislocations are distributed non-uniformly, which can pose a problem during the manufacture of the devices.

Another solution consists of making the material epitaxially overgrow on preexisting pads of this material: this is the so-called pendeo-epitaxy method, which makes it possible to avoid overgrowth on the mask. However, conventional pendeo-epitaxy solutions do not make it possible to remove, even significantly reduce, the appearance of defects generated by the coalescence of adjacent germs.

Patent application WO2019122461 describes a solution illustrated in FIGS. 1A to 1D:

a. A first step consists of providing a stack comprising a creep layer 200, a crystalline layer 300 and a nitride layer 500 or priming layer 500, typically a gallium nitride (GaN) layer. A buffer layer 400 can also be present between the creep layer and the nitride layer 500. This step is illustrated in FIG. 1A.

b. A second step consists of forming pads 1000A1-1000A4, 1000B1-1000B4 by etching of the crystalline layer 300, optionally of the buffer layer 400, and at least one portion of the creep layer 200 (FIG. 1B). Each pad thus comprises a creep section 220A1-220A4, 220B1-220B4 coming from the creep layer 200 and a crystalline section 300A1-300A4, 300B1-300B4 coming from the crystalline layer 300.

c. Making the crystallites 510A1-510A4, 510B1-510B4 epitaxially grow on the pads 1000A1-1000A4, 1000B1-1000B4 and this, until their coalescence (FIGS. 1C and 1D). The layer 550A/550B thus formed can continue its growth by thickening.

During their epitaxial growth, the crystallites formed at the top of the pads coalesce to form a continuous layer 550A/550B intended to form an optoelectronic or electronic device. During epitaxy, the portion of the pad which is formed by the creep section reaches (or exceeds) its vitreous transition temperature or a temperature which is very close to the latter. Under the force of a mechanical stress, this pad portion 560 can thus be deformed (FIG. 1E). Thus, when two crystallites come into contact and coalesce, the mechanical stresses generated by this contact are transferred to the pads and therefore to the creep sections supporting them. The latter are deformed, absorbing, due to this, some of the mechanical stresses. This mobility of the pads, due to the presence of the creep sections, makes it possible, in particular, to accommodate relative disorientations of crystallites to one another, whether this is in the plane into which the substrate mainly extends ("twist") or outside of the plane ("tilt").

However, it appears that this method does not make it possible to obtain satisfactory defect densities. As illustrated in FIGS. 2A and 2B, continuous layers obtained by such a method have, in places, very high orientation angles of the nitride layer-based material, conveying the existence of structural defects which are damaging for the manufacture of devices from these continuous layers.

There is therefore a need consisting of limiting, even removing the disadvantages of known solutions. The present invention aims, in particular, to propose a solution to respond to this need.

An aim of the present invention is to propose a solution to obtain a nitride layer (N) obtained from at least one from among gallium (Ga), indium (In) and aluminium (Al), having a significantly reduced defect density.

SUMMARY

To achieve this aim, according to an embodiment, a method for obtaining a layer made a least partially of a nitride (N), obtained preferably from at least one from among gallium (Ga), indium (In) and aluminium (Al) is provided, comprising the following steps:

a. providing a stack comprising at least one assembly of pads extending from a substrate, each pad comprising at least:
  i. one first section, called creep section, formed in an amorphous material having a vitreous transition temperature $T_{vitreous\ transition}$;
  ii. one second section, crystalline, called crystalline section, surmounting the creep section, b. making a crystallite epitaxially grow on at least some of said pads and continuing the epitaxial growth of the crystallites until coalescence of the crystallites carried by the pads of the assembly of pads, so as to form a nitride layer.

The method is characterised in that the pads of said assembly of pads are distributed over the substrate, such that the relative arrangement of the pads of the assembly of pads is such that during the epitaxy of the crystallites, the progressive coalescence of the crystallites is always done between, on the one hand, an assembly, called coalesced assembly, comprising a crystallite or a plurality of coalesced crystallites and, on the other hand, at least one crystallite, called isolated crystallite, not having already coalesced with other crystallites.

Thus, at a coalescence point, the progressive coalescence of crystallites is always done between, on the one hand, a crystallite or a plurality of coalesced crystallites, and on the other hand, one single crystallite, also being able to be qualified as isolated crystallite, since it has not been coalesced beforehand with one or more other crystallites. The creep section underlying said isolated crystallite has the entire mobility necessary to compensate for possible misalignments and disorientations between the isolated crystallite and the crystallite or the plurality of coalesced crystallites to which it coalesces. Thus, the formation of structural defects is avoided within the crystallites and therefore the continuous layer, during successive coalescences, which makes it possible to ultimately obtain a continuous layer of excellent quality.

Electronic and optoelectronic devices, for example, LEDs or vertical devices, such as vertical transistors or lateral components like HEMT transistors, having very good performances can thus be manufactured from these layers having low densities of structural defects.

BRIEF DESCRIPTION OF THE FIGURES

The aims, objectives, as well as the features and advantages of the invention will best emerge from the detailed description of an embodiment of the latter, which is illustrated by the following accompanying drawings, in which:

FIGS. 1A to 1E illustrate steps of a method for forming a continuous layer according to the prior art.

FIG. 3A illustrates an example of a stack from which an example of a method according to the invention can be implemented.

FIG. 3B illustrates the stack of FIG. 3A on which a priming layer is formed.

FIG. 3C illustrates the result of a step consisting of forming an assembly of pads from the stack of FIG. 3A or that of FIG. 3B.

FIG. 3D illustrates a phase of epitaxially growing crystallites on the top of the pads, this growth phase not being completed.

FIGS. 3E to 3H illustrate the successive coalescences of the crystallites to form a continuous layer.

FIGS. 4A and 4B illustrate an example in which the pads are disposed along a logarithmic spiral.

FIG. 4C illustrates an example in which some of the pads are disposed along several parallel axes of alignment.

FIG. 4D illustrates an example in which the pads are disposed along an axis of alignment.

FIGS. 4E and 4F illustrate an example in which the pads are disposed along five concurrent axes of alignment.

Figure 1A:
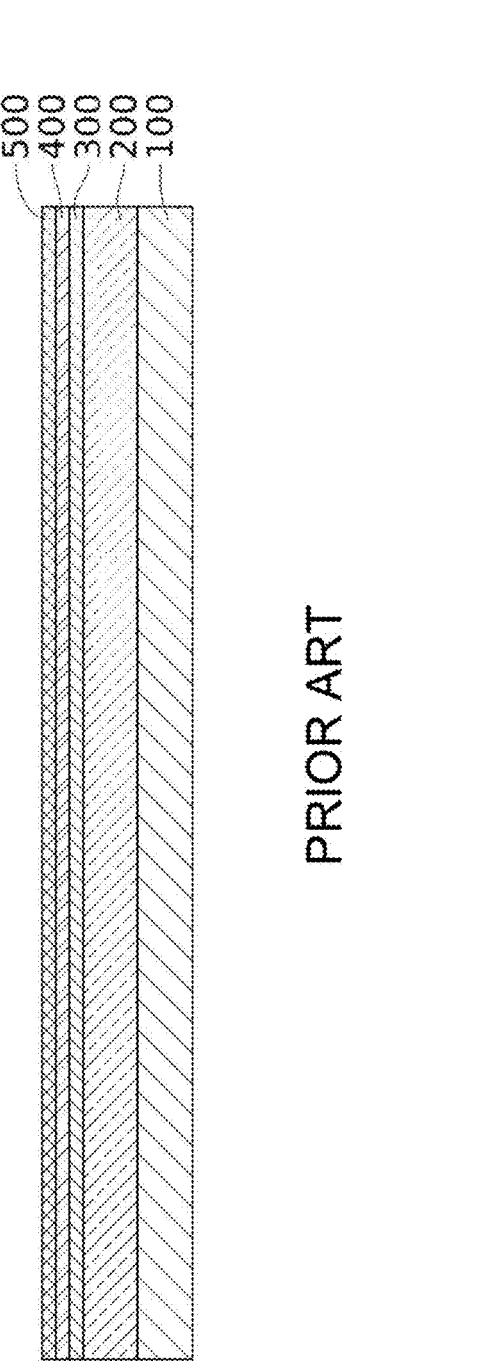
Figure 1B:
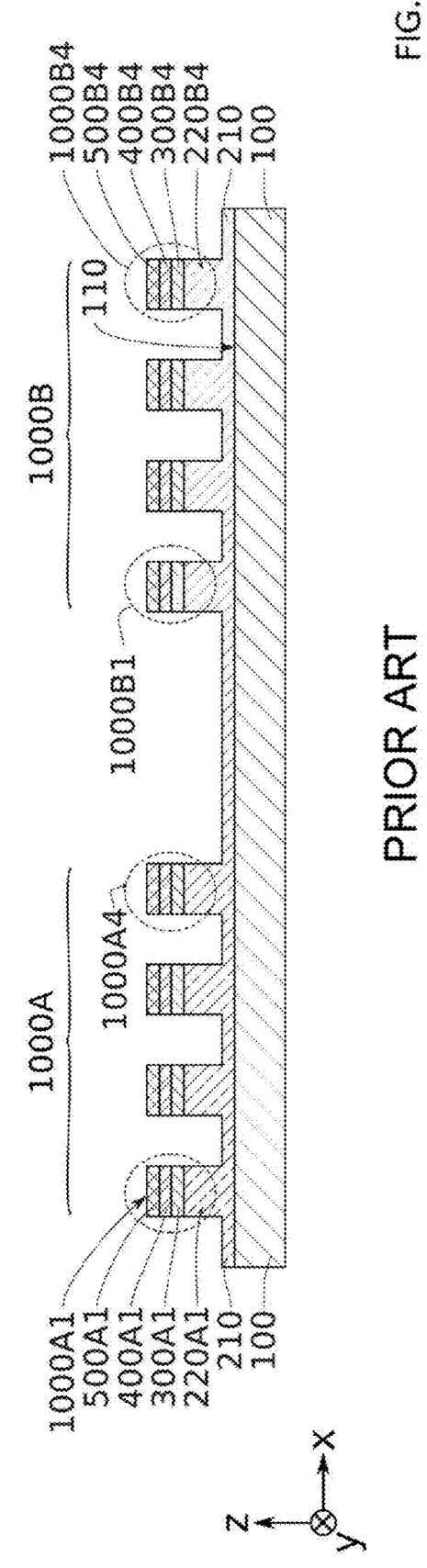
Figures 1C, 1D:
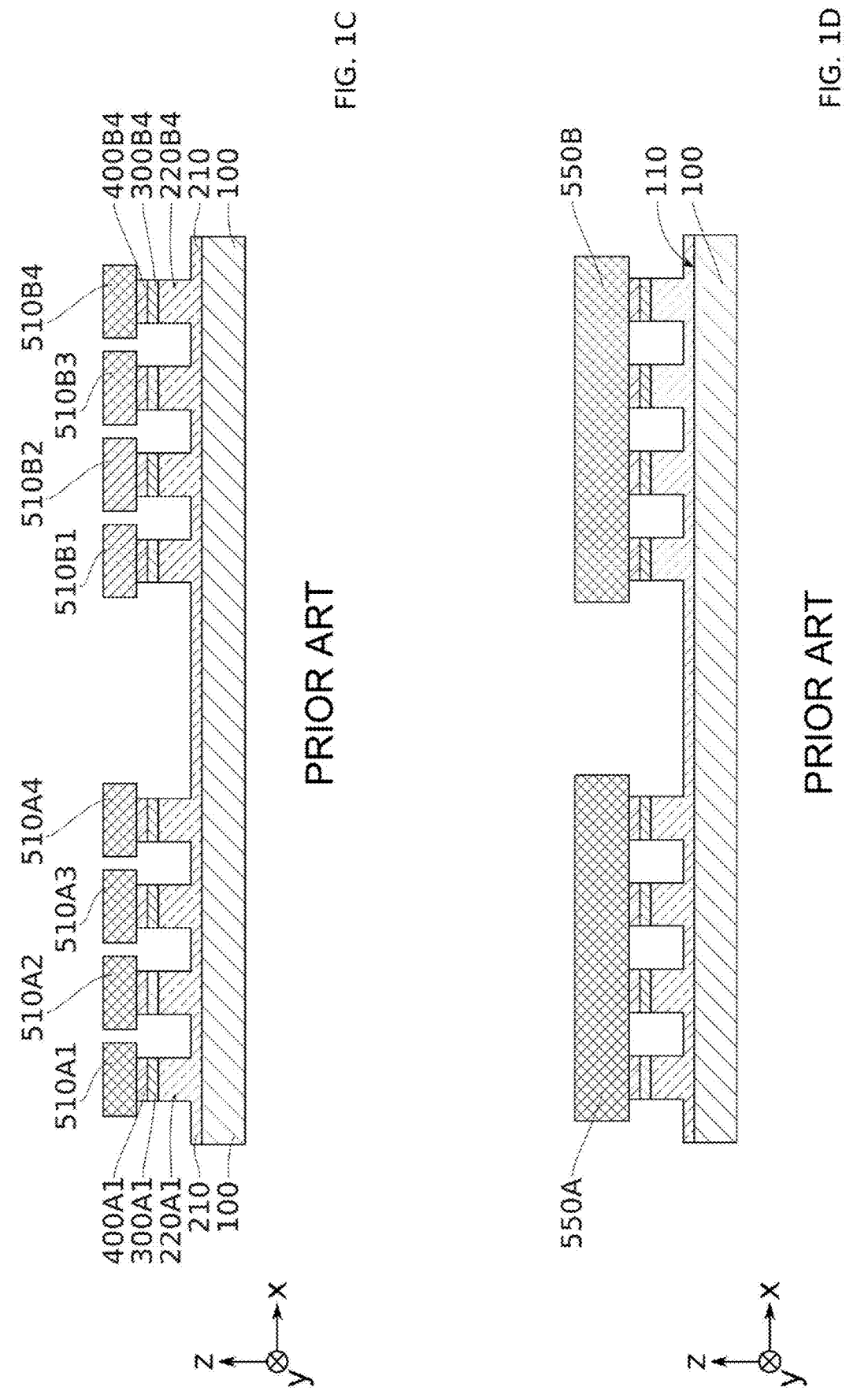
Figure 2A:
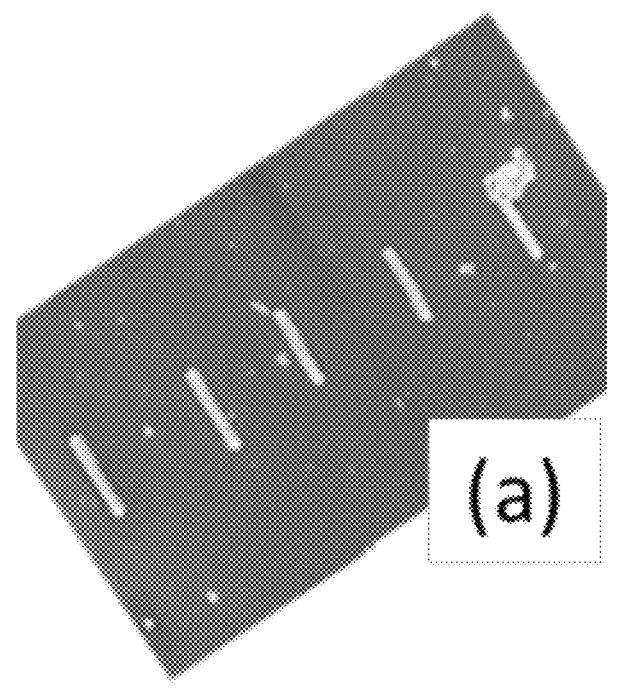
FIG. 2A is a photo obtained with a scanning electron microscope (SEM) which illustrates continuous layers obtained by the method illustrated in FIGS. 1A to 1E.
Figure 2B:
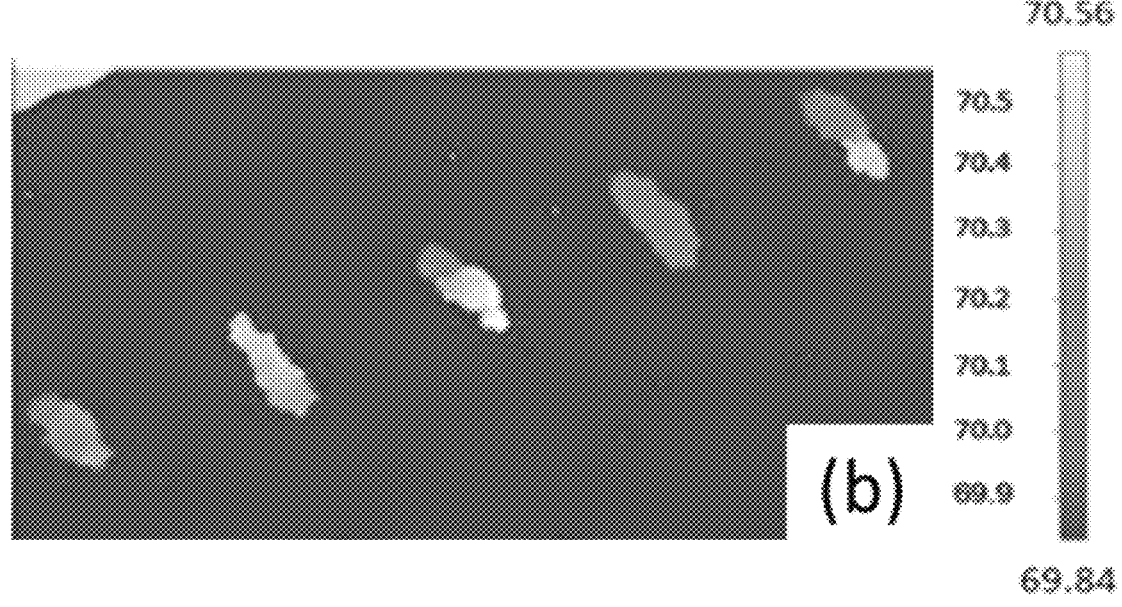
FIG. 2B is an image obtained by dark field X-ray microscopy showing the orientation variations of crystallites obtained by the method illustrated in FIGS. 1A to 1E.

The drawings are given as examples and are not limiting of the invention. They constitute principle schematic representations intended to facilitate the understanding of the invention and are not necessarily to the scale of practical applications. In particular, the relative thicknesses of the different layers, sections, crystallites and continuous layers are not representative of reality.

DETAILED DESCRIPTION

Before starting a detailed review of embodiments of the invention, optional features are stated below, which can optionally be used in association or alternatively:

According to an advantageous embodiment, the pads carrying the crystallites forming the nitride layer are substantially disposed, projecting into a horizontal plane, into which the upper face of the substrate extends, along a logarithmic spiral.

According to an embodiment, the pads carrying the crystallites forming the continuous nitride layer are, projecting into a horizontal plane, into which the upper face of the substrate mainly extends, substantially aligned along at least one axis of alignment.

According to an embodiment, the pads disposed on one same axis of alignment are spaced apart by an increasing distance, by travelling the axis of alignment along a given direction from a given point, called initial point.

According to an example, the pads carrying the crystallites forming the continuous layer are separated by a distance varying logarithmically step by step, said distance being measured along their axis of alignment.

According to an example, the pads carrying the crystallites forming the continuous nitride layer are substantially aligned, projecting into a horizontal plane, into which the upper face of the substrate mainly extends, along concurrent axes, the concurrent axes verifying between them, a symmetry of rotation about a central point projecting into the horizontal plane.

According to an example, the pads are aligned along five concurrent axes.

According to an example, the epitaxial growth is done at a temperature $T_{epitaxy}$, such that $T_{epitaxy} > k_1 \times T_{vitreous\ transition}$, with $k_1 \geq 0.8$.

According to an example, $k_1 \geq 1$, and preferably $k_1 \geq 1.5$.

Advantageously, the assembly of pads comprises at least 3 pads.

According to an embodiment, the stack comprises a plurality of assemblies of pads on the substrate, a continuous nitride layer being formed from each assembly of pads, the epitaxial growth of the crystallites being interrupted before the crystallites belonging to two assemblies of distinct pads do not coalesce, such that the continuous layers formed from each assembly of pads are distant from one another.

In this embodiment, in which several assemblies make it possible to form several continuous layers and separate from one another on one same plate, these different continuous layers are typically called "vignettes". Each of these vignettes can then be involved in the production of an electronic or optoelectronic arrangement, such as an LED or micro-LED or a vertical device such as a vertical transistor. The features described below in reference to an assembly of pads, its crystallites and to the continuous layer formed from this assembly of pads apply mutatis mutandis to the other assemblies of pads, the crystallites that they carry and the continuous layers formed by coalescence of these crystallites.

According to an example, each pad has an upper face and in which the epitaxial growth of the crystallites is done partially at least and preferably only from said upper face.

According to an example, the method further comprises a formation step in the continuous layer of a device, the device being taken from among an LED and a transistor, for example, a vertical transistor, for example, a HEMT-type transistor.

According to an embodiment, the pads of said assembly of pads are distributed over the substrate, such that the relative arrangement of the pads of the assembly of pads is such that during the epitaxy of the crystallites, at least at certain instants, the progressive coalescence of the crystallites is done between, on the one hand, said coalesced assembly, and on the other hand, several isolated crystallites.

Alternatively, the pads of said assembly of pads are distributed over the substrate, such that the relative arrangement of the pads of the assembly of pads is such that during the epitaxy of the crystallites, the progressive coalescence of the crystallites is always done between, on the one hand, said coalesced assembly, and on the other hand, one single isolated crystallite.

According to an example, each pad has a cross-section, the maximum dimension $d_{pad}$ of which is between 10 and 500 nm ($10^{-9}$ metres), the maximum dimension $d_{pad}$ being measured in a plane parallel to a horizontal plane into which the upper face of the substrate mainly extends, preferably 20 nm$\leq d_{pad} \leq$200 nm and preferably 50 nm$\leq d_{pad} \leq$100 nm.

According to a preferred example, the continuous layer has a cross-section, the maximum dimension $d_{layer}$ of which is between 0.5 and 10 μm ($10^{-6}$ metres), the maximum dimension $d_{layer}$ being measured in a plane parallel to a horizontal plane into which the upper face of the substrate mainly extends, preferably 0.8 μm$\leq d_{layer} \leq$3 μm and preferably 1 μm$\leq d_{layer} \leq$2 μm.

Preferably, the creep layer is made of a material taken from among:

a. a silicon oxide SixOy, x and y being integers, and preferably the creep layer is made of SiO2,
    b. a glass,
    c. a borosilicate glass,
    d. a borophosphosilicate glass (BPSG).

Advantageously, $T_{epitaxy} \leq k_2 \times T_{melting\ min}$, $T_{melting\ min}$ being the lowest melting point from among the melting points of sections forming the pads, with $k_2 \leq 0.9$ and preferably $k_2 \leq 0.8$.

According to an advantageous embodiment, the pads comprise at least one buffer layer surmounting the crystalline layer, and made of a material which is different from that of the continuous nitride layer, and preferably the continuous nitride layer is made of gallium nitride (GaN) and the buffer layer is made of aluminium nitride (AlN). This makes it possible to avoid the alteration phenomena of the GaN layer by reaction with the silicon layer, phenomena usually qualified as "melt-back etching").

According to an example, the pads comprise, before the step of epitaxially growing the continuous nitride layers, at least one priming layer, surmounting said buffer layer and made of gallium nitride (GaN).

According to an advantageous example, providing said stack comprises providing a silicon on insulator (SOI)-type developed substrate, comprising a base substrate successively surmounted by an oxide layer forming said creep layer and a semiconductive layer forming said crystalline layer.

According to an advantageous example, the creep section has a height $e_{220}$ such that $e_{220} \geq 0.1 \times d_{pad}$, $d_{pad}$ being the diameter of the pad, or more generally, the edge-to-edge distance of the pad taken, at the creep section and in a direction parallel to a horizontal plane into which an upper face of the substrate mainly extends, preferably $e_{220} \geq 1 \times d_{pad}$.

According to an example, the step of forming the pads comprises the etching of the crystalline layer and the etching of only one portion of the creep layer, so as to preserve a portion of the creep layer between the pads.

Below in the description, the terms "crystals" and "crystallites" will be considered as equivalent.

It is specified that in the scope of the present invention, the terms "on", "surmounts", "covers" or "underlying" or their equivalents do not mean "in contact with". Thus, for example, "the deposition of a first layer on a second layer" does not compulsorily mean that the two layers are directly in contact with one another, but this means that the first layer covers at least partially, the second layer by being either directly in contact with it, or by being separate from it by at least one other layer or at least one other element including air. Likewise, "a pad surmounting a first layer" does not mean that the pad is necessarily in contact with this first layer, but means that the pad is either in contact with this first layer, or in contact with one or more layers disposed between the first layer and the pad.

The steps of forming the different layers and regions are meant in the broad sense: they can be carried out in several substeps which are not necessarily strictly successive.

In the description below, the thickness or the height is taken along a direction perpendicular to the main faces of the different layers. In the figures, the thickness or the height is taken along the vertical or along the axis z of the orthogonal system illustrated in FIGS. 1A to 1E, 3A to 3H and 5A and 5B.

Likewise, when it is indicated that an element is located at the right of another element, this means that these two elements are both located on one same line perpendicular to the main plane of the substrate, either on one same line oriented vertically (axis z) in the figures.

By a substrate, a layer, a device "with the basis" of a material M, this means a substrate, a layer, a device comprising this material M only, or this material M and optionally other materials, for example, alloy elements, impurities or doping elements.

The terms "substantially", "around", "about" mean "plus or minus 10%" or, when this is an angular orientation "plus or minus 10%". Thus, a direction substantially normal to a plane means a direction having an angle of 90±10° with respect to the plane.

The term "micro-LED" means an LED, at least one dimension of which taken in a plane parallel to the main plane into which the substrate supporting the micro-LED extends (i.e. the plane XY of the orthogonal system referenced in the figures) is micrometric, i.e. strictly less than 1 mm ($10^{-3}$ metres) and preferably less than or equal to 100 μm (1 μm=$10^{-6}$ metres). In the scope of the invention, the micro-LEDs have, projecting into a main extension plane parallel to the main faces of the micro-LEDs, i.e. parallel to an upper face of the substrate, maximum dimensions of micrometric dimension in the plane. Preferably, these maximum dimensions are less than a few hundred micrometres. Preferably, these maximum dimensions are less than 100 μm.

In the present invention, "vertical devices" means devices in which the charge carriers move in the thickness of the layer, i.e. along a direction perpendicular to the planes into which the main faces of this layer extend.

In the present invention, by "HEMT-type transistors" (High Electron Mobility Transistors), this means field-effect transistors with high electron mobility, sometimes called by the term of heterostructure field-effect transistors. Such a transistor includes the superposition of two semiconductive layers having different band gaps which form a quantum well at their interface. Electrons are confined in this quantum well to form a two-dimensional electron gas. For reasons for keeping at a high voltage and at a high temperature, the materials of these transistors are chosen so as to have a wide energy band gap.

An example of a method for forming a continuous layer according to the invention will now be described in reference to FIGS. 3A to 3H.

It will be noted that, according to an example, the method described below makes it possible to form one single continuous layer on a substrate 100 or on a plate. According to another example, the method described below makes it possible to form a plurality of continuous layers on one same substrate 100 or on one same plate. In the latter case, each layer is separate from the others and can be qualified as a vignette. Each vignette can thus serve to produce a device such as an LED or a micro-LED or any other nitride-based vertical device such as an HEMT-type transistor.

Figure 3A:
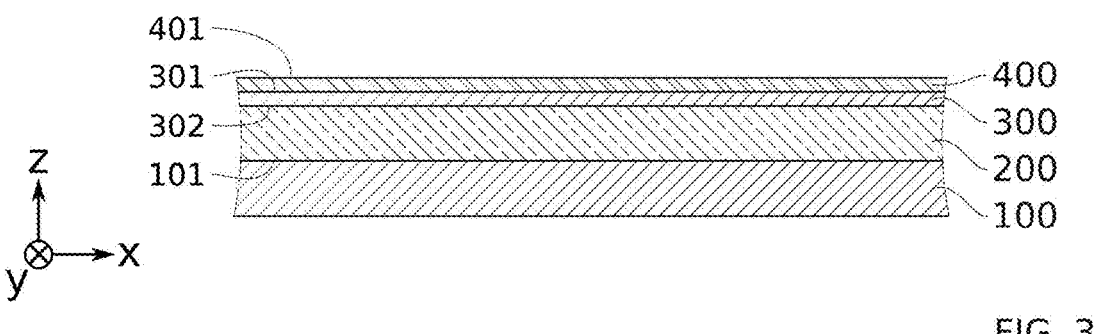
FIGS. 3A to 3H illustrate steps of a method according to a non-limiting example of the method according to the present invention.

As illustrated in FIG. 3A, a stack is provided, comprising at least one substrate 100, surmounted successively by a creep layer 200 and a crystalline layer 300. Thus, the creep layer 200 is disposed between the substrate 100 and the crystalline layer 300.

According to an example of an embodiment, the substrate 100 is silicon-, amorphous- or crystalline-based. It ensures the mechanical strength of the stack.

The crystalline layer 300 has a lower face 302 facing the creep layer 200 and an upper face 301, the function of which is to serve as a base layer to epitaxially grow the nitride of the continuous layer 500A that is sought to be ultimately obtained. For example, the layer that is sought to be ultimately obtained is a gallium nitride GaN layer. According to an example of an embodiment, the crystalline layer 300 is monocrystalline silicon-based. Alternatively, the crystalline layer 300 can be SiC- or $Al_2O_3$-based.

Preferably, the creep layer 200 is made of a viscous material. The creep layer 200 has a vitreous transition temperature. It therefore has a vitreous transition and has the behaviour of vitreous transition materials. Like all materials having a vitreous transition temperature, the creep layer 200, under the effect of a temperature increase, is deformed without breaking and without returning to its initial position after a drop in temperature. On the contrary, the crystalline layer 300 does not naturally have vitreous transition. The crystalline layer 300 is deformed, then is dislocated and can break. Consequently, the creep layer 200 and the crystalline layer 300 are different. The creep layer 200 is not crystalline.

The creep layer 200 is made of an amorphous material such as an oxide, preferably a silicon oxide $Si_xO_y$, such as $SiO_2$. The role of this layer will be explained below in the description.

Advantageously, but in a non-limiting manner, this stack comprising the substrate 100, the creep layer 200 and the crystalline layer 300 constitutes a semiconductor on insulator-type substrate, preferably silicon on insulator (SOI). In this case, the creep layer 200 is formed by the buried oxide (BOX) layer of the SOI substrate.

According to an example of an advantageous embodiment illustrated in FIG. 3A, a buffer layer 400 is deposited by epitaxy on the upper face 301 of the crystalline layer 300. When the continuous layer 550A/550B that is sought to be ultimately obtained is formed of GaN and that the crystalline layer 300 is a silicon-based layer, this buffer layer 400 is typically made of aluminium nitride (AlN). This makes it possible to avoid the so-called "Melt-back etching" phenomenon, generated by the very high reactivity between silicon and gallium at usual epitaxy temperatures (1000/1100° C.) and which leads to very highly degrading the continuous GaN layer 550A/550B.

Typically, the thickness of the AlN layer is between 10 and 200 nanometres ($10^{-9}$ metres).

Figure 3B:
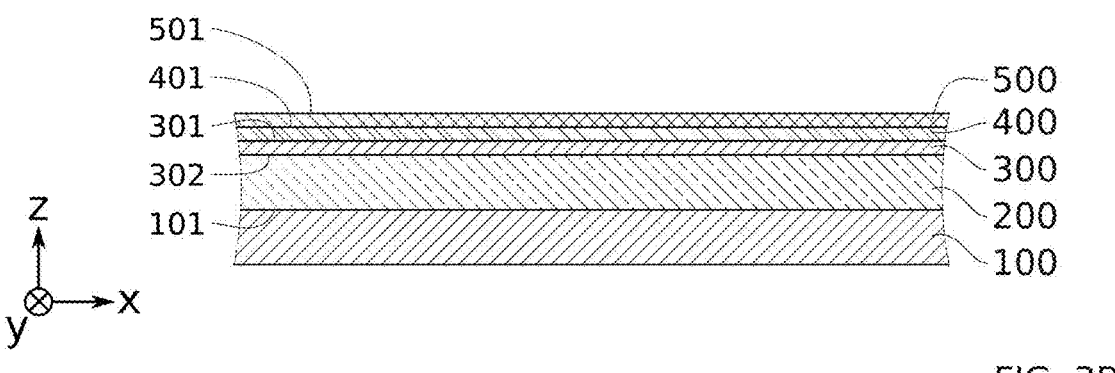

As illustrated in FIG. 3B, a priming layer 500 can also be deposited by epitaxy, on the upper face 401 of the buffer layer 400. This priming layer 500 has the function of facilitating the regrowth of the crystallites 510A1-510A5 during the following steps. In this case, it is from an upper face of the priming layer 500 that the epitaxial growth of the crystallites 510A1-510A5 is at least partially produced, the crystallites being illustrated in FIG. 3D. This priming layer 500 is preferably produced in the same material as that of the continuous layer 550A that is sought to be ultimately obtained. Typically, when the material of the continuous layer 550A is gallium nitride GaN, the priming layer 500 is also made of GaN. This priming layer 500 typically has a thickness of between 50 and 200 nanometres.

For concision and clarity, only five pads 1000A1-1000A5 are represented in the figures to support a continuous layer 550A. Naturally, a continuous layer 550A can be formed on a greater number of pads. As will be described below, the number of pads, as well as their period will be adapted according to the desired size for the micro-LED.

It will be noted that the buffer 400 and priming 500 layers are only optional. Thus, according to the embodiments not illustrated in FIGS. 3A to 3H, only the buffer layer 400 or only the priming layer 500, or also none of these two layers 400 and 500 can be provided.

Figure 3C:
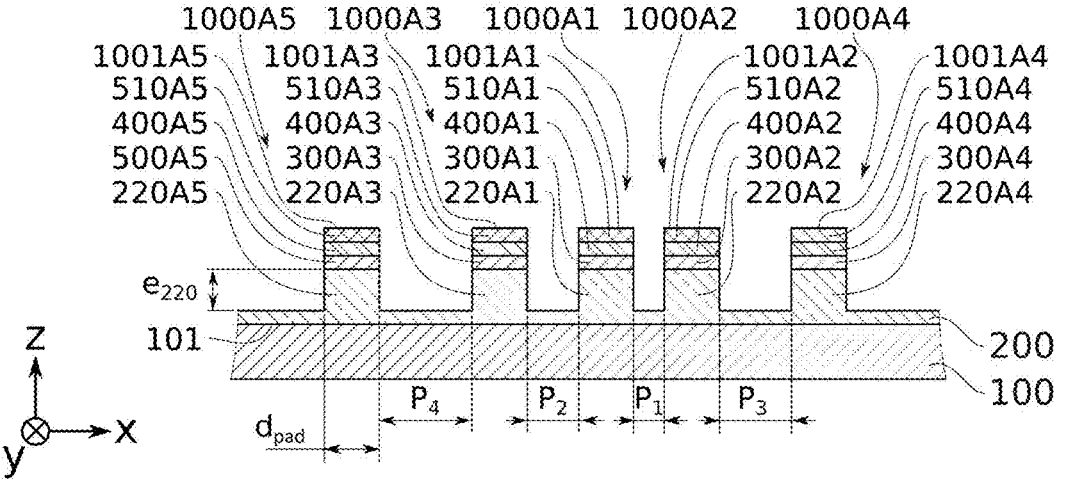

As illustrated in FIG. 3C, then the pads (or posts) 1000A1-1000A5 are formed from the stack. These pads are obtained by etching the stack up to into the creep layer 200, at least some of the etching extending within the creep layer 200.

To form the pads by etching, numerous etching techniques which are known to a person skilled in the art can be resorted to. In particular, conventional lithography techniques can be used, such as photolithography techniques comprising the formation of a mask, for example made of resin, then the transfer of the patterns of the mask into the stack. Also, electron beam (e-beam) lithography techniques or nanometric printing techniques can be resorted to.

These pads 1000A1-1000A5 are small and can be qualified as nano-pads. Typically, the maximum dimension of the cross-section of the pads, taken in a plane parallel to the horizontal plane XY of the orthogonal system XYZ or to the plane of the upper face 101 of the substrate 100, and referenced $d_{post}$ in FIG. 3C, is between a few tens and a few hundreds of nanometres. More specifically, $d_{pad}$ is between 10 and 500 nanometres and preferably between 20 and 150 nm and preferably between 50 and 100 nm, for example, around 50 nm or 100 nm. If the pads are of circular cross-sections, this maximum dimension $d_{pad}$ corresponds to the diameter of the pads. If the pads are of hexagonal cross-section, this maximum dimension $d_{pad}$ corresponds to the diagonal or to the diameter of the circle passing through the angles of the hexagon. If these pads are of rectangular or square cross-section, this maximum dimension $d_{pad}$ corresponds to the largest diagonal. It is understood that the cross-section of the pads can have a shape other than circular, hexagonal, rectangular or square.

In the scope of the present invention, the pads 1000A1-1000A5 are particularly distributed projecting into the plane XY: their arrangement is such that, as will be illustrated further, the coalescences intervening successively during the implementation of the method, on the one hand, bring into play one single crystallite 510A1 (during the first coalescence which will be described below in reference to FIG. 3E) or a plurality of crystallites already coalesced 510A1-510A4 (during the following coalescences, FIGS. 3F to 3H), and on the other hand, at least one isolated crystallite 510A2-510A5. In other words, the arrangement of the pads 1000A1-1000A5 makes it possible to avoid any coalescence between, on the one hand, a first plurality of coalesced crystallites, and on the other hand, a second plurality of coalesced crystallites. To do this, the pads 1000A1-1000A5, in particular, do not all have the same distance with their first neighbouring pads. The arrangement of the pads 1000A1-1000A5 must, in particular, consider the increase of the dimensions projecting into the plane XY of the crystallites 510A1-510A5 according to their epitaxial growth. Examples of arrangement of the pads 1000A1-1000A5 will be given below in reference to FIGS. 4A to 4F.

As illustrated in FIG. 3C, the pads are etched through the entire priming layer 500, the entire buffer layer 400 (when the latter are present) and the entire crystallite layer 300. Preferably, only one portion 220 of the creep layer 200 is etched. This embodiment has the advantage of avoiding, that during epitaxy, the nitride of the continuous layer 550A is developed on the creep sections 220. This selectivity of the epitaxy is met, in particular, when the continuous nitride layer 550A that is epitaxially grown is GaN and that the creep sections are made of $SiO_2$. On the contrary, if, with these same materials, the creep layer 200 is etched over its entire thickness, thus, during epitaxy, the nitride of the continuous layer 550A is developed from the upper face 101 of the substrate 100, usually formed of silicon. This situation is clearly not desirable.

Moreover, it has been observed that the fact of preserving an unetched portion 210 of the creep layer 200 makes it possible to facilitate the creep of the section 220, in particular when the crystallites are twistingly disoriented, i.e. in the main extension planes of the continuous layer 550A that is sought to be obtained. These main extension planes 550A are parallel to the horizontal plane XY of the system XYZ.

Preferably, the etched thickness $e_{220}$, and therefore forming the height of the creep section 220, is equal to half of the thickness of the creep layer 200. This makes it possible to have a very good reorientation of the crystallites during the formation of grain boundaries.

Figure 3D:
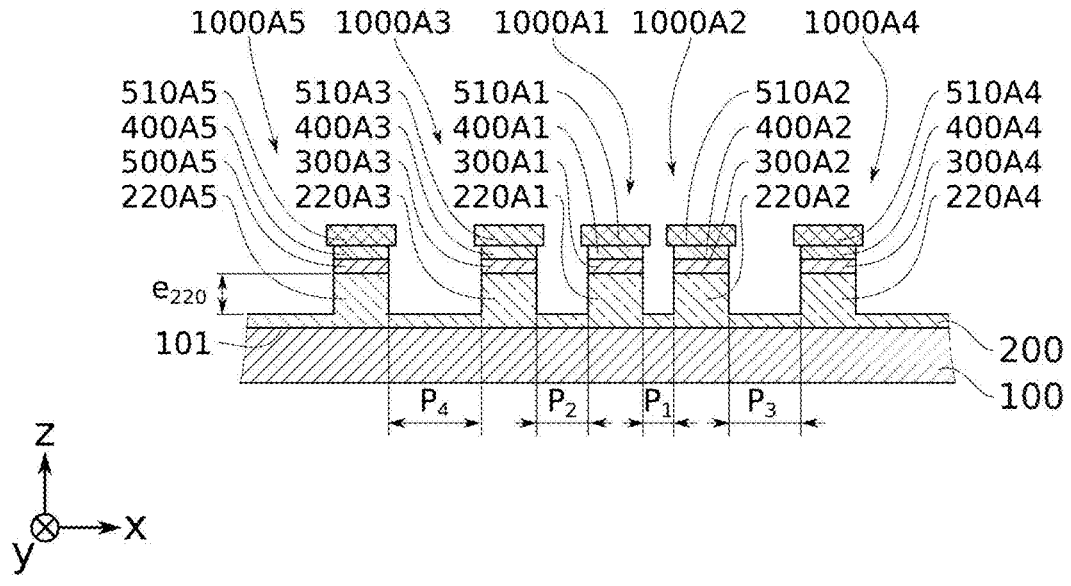
Figure 3E:
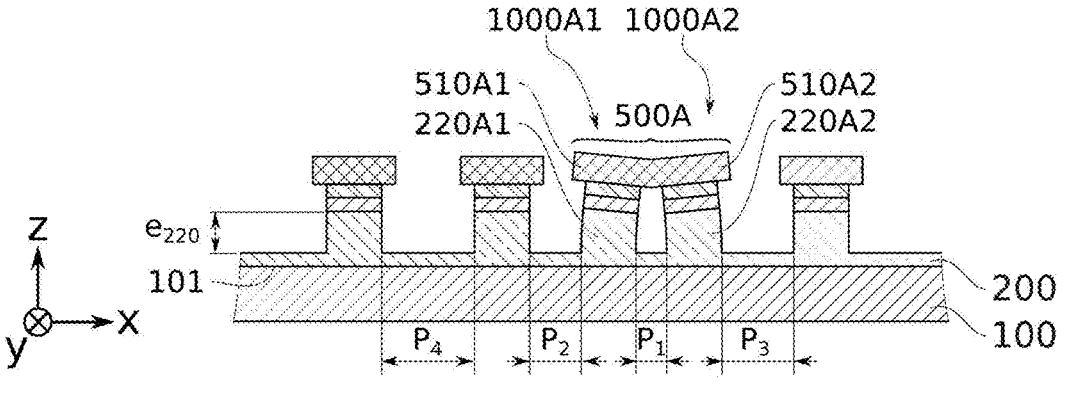

FIG. 3D illustrates the formation of crystallites 510A1-510A5 through epitaxial growth from the priming layer 500 (or from the upper face 301 of the crystalline layer 300 when the layers 400 and 500 are absent).

As illustrated in this FIG. 3D, the pads 1000A1-1000A5 each support a crystallite 510A1-510A5 carried by a stack of sections 400A1-400A5, 300A1-300A5, 220A1-220A5. The sections extend along the main extension direction of the pad, i.e. vertically (Z) in FIGS. 3A to 3H.

The sections form circular cylinders if the cross-section of the pads is mainly circular. If the cross-section of the pads 1000A1-1000A5 is polygonal, for example hexagonal, the sections thus form cylinders of hexagonal cross-section. Preferably, the sections are solid. The cross-section of the pads is taken parallel to the horizontal plane XY, that is parallel to the planes into which the creep layer 220 and the crystalline layer 300 mainly extend.

Whatever the embodiment retained, i.e. with or without priming layer 500 and with or without buffer layer 400, the epitaxial growth of the crystallites 510A1-510A5, is done partially at least or only from the upper face 1001A1-1001A5 of the pad 1000A1-1000A5. Thus, this upper face 1001A1-1001A5 is formed, either through the crystalline section 300A1-300A5, or through the section 500A1-500A5 formed by the priming layer 500, or by the section 400A1-400A5 formed by the buffer layer 400. This makes it possible, in particular, to rapidly obtain crystallites 510A1-510A5 of significant thickness.

It will be noted that the upper faces 401, 501 of the buffer layer 400 and of the priming layer 500, i.e. the rotated faces facing the continuous layer 550A that are sought to be grown, have gallium (Ga)-type biases, and not nitrogen (N), which considerably facilitates the obtaining of a continuous layer 550A of great quality epitaxially grown nitride.

The growth of the crystallites 510A1-510A5 continues and extends laterally, in particular along planes parallel to the plane xy. The crystallites 510A1-510A5 are developed up to those carried by the two pads closest to one another, referenced 1000A1 and 1000A2 in FIGS. 3C to 3H and distant by a distance $P_1$, coalescent (FIG. 3E). This coalescence occurs without dislocations or with few dislocations within the crystallites. It makes it possible to form a continuous layer 500A from the crystallites 510A1 and 510A2. This continuous layer 500A constitutes a coalesced assembly.

Figure 3F:
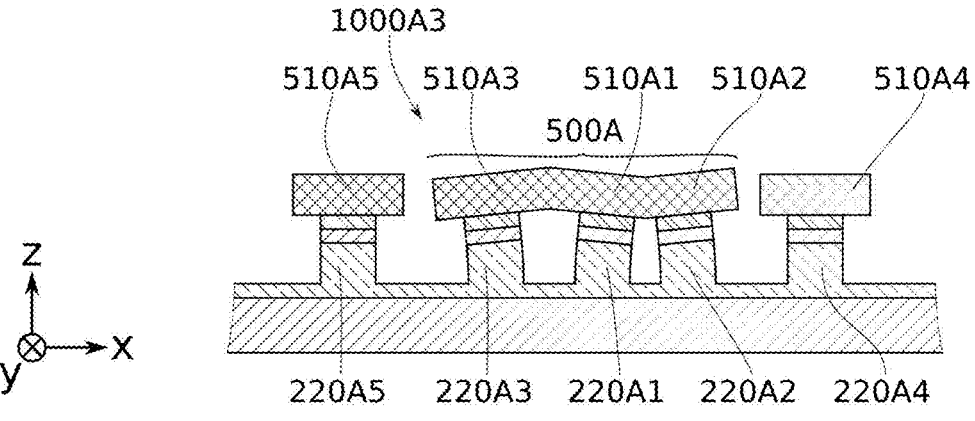

The growth of crystallites involved in this first coalescence 510A1, 510A2 as well as other crystallites 510A3-510A5 continues until that continuous layer 500A formed by the crystallites 510A1 and 510A2 coalesces with the crystallite 510A3 carried by the closest pad 1000A3. The crystallite 510A3 is thus added to the coalesced assembly. It must be noted that, due to the distribution of the pads 1000A1-1000A5 on the substrate, from the start of its growth (FIG. 3D) and until this step of the method (FIG. 3F), the crystallite 510A3 being coalesced at the continuous layer 550A has never coalesced with another crystallite. Its pad 1000A3 therefore has all the mobility necessary to accommodate the alignment defects in the plane XY or outside of the plane with the continuous layer 550A formed by the first two coalesced crystallites 510A1, 510A2. In FIG. 3F, a deformation of the creep section 220A3 according to its "tilt" angle is illustrated. A deformation of this creep section 220A3 according to the "twist" angle can intervene alternatively or simultaneously. The properties of its creep section 220A3 make it possible to significantly reduce the defects at the interface between the continuous layer 550A and the crystallite 510A3. Explanations on the interest of this precaution are given further.

The continuous layer 500A is thus formed by the crystallites 510A1, 510A2 and 510A3.

Figure 3G:
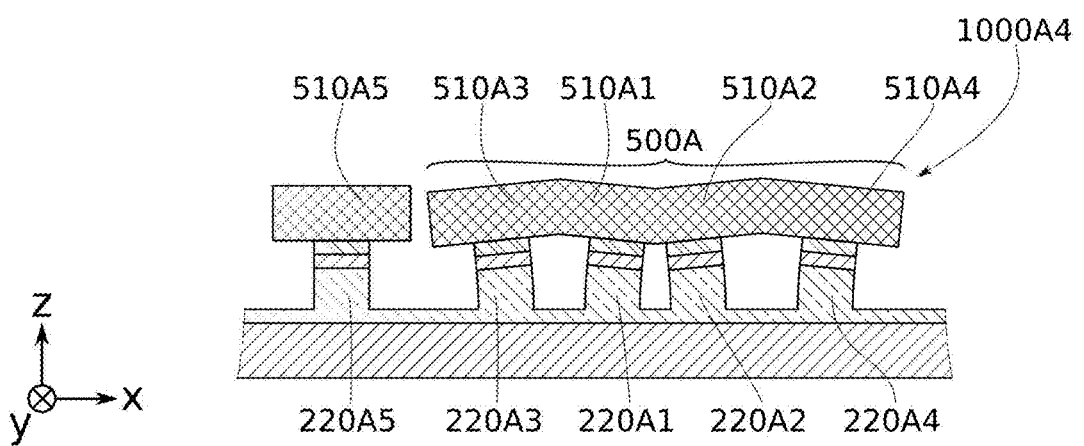

The growth of the continuous layer 500A continues, as well as that of the crystallites not yet coalesced 510A4, 510A5. Another coalescence occurs when the continuous layer 500A comes into contact with the crystallite 510A4 (FIG. 3G). The creep section 220A4 of the latter is deformed such that the pad 1000A4 in its entirety is deformed and thus accommodates any misalignment and any disorientation of the continuous layer 500A with the crystallite 510A4. The crystallites 510A4 and 510A5 is thus added to the coalesced assembly.

Figure 3H:
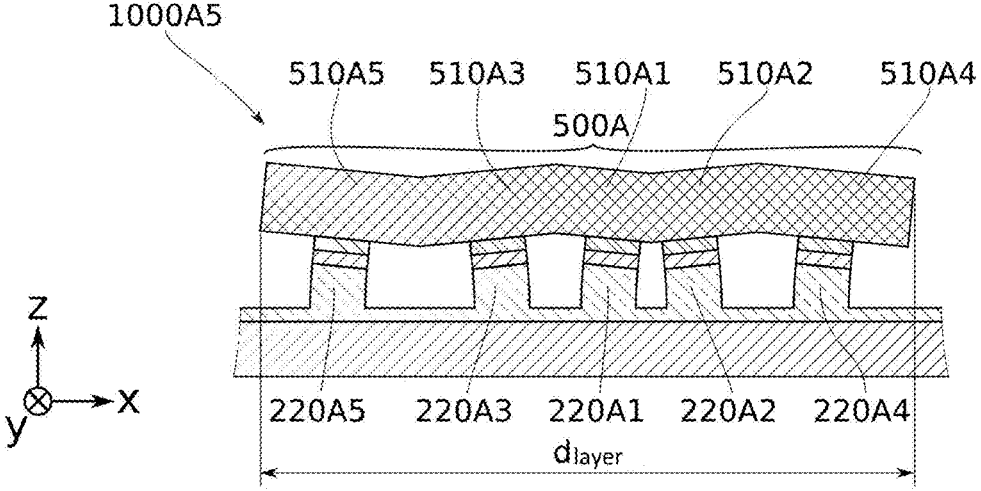

Finally, FIG. 3H illustrates a coalescence making it possible to integrate the crystallite 510A5 to the continuous layer 500A (i.e. to the coalesced assembly).

As this clearly emerges from the figures, the continuous layer 550A extends at the end of the method between several pads 1000A1-1000A5 and forms a continuous layer.

It is understood that FIGS. 3A to 3H illustrate the example of a continuous layer 500A formed by adding one single crystallite 510 to each coalescence step, but that it can be fully considered that several crystallites 510A1-510A5 coalesce simultaneously at the continuous layer 500A, as soon as these are not themselves already coalesced to one another or to one or more other crystallites. Such an example will be described further in reference to FIG. 4F.

FIGS. 3A to 3H do not have the aim of giving a visual representation close to reality relating to the deformation of creep sections. These figures aim to give a schematic representation to easily understand the principle of coalescence of crystallites without dislocation at the coalescence boundaries. In particular, the deformations of the creep sections are not represented in all the planes for concision. Moreover, the deformations of the pads have been exaggerated for explanatory purposes. The upper surface of the continuous layer obtained at the end of the method has an appearance which is a lot less rough than that represented, even smooth.

The growth of the crystallites 510A1-510A5 do not extend downwards. Moreover, this growth is selective, in that it does not occur on the creep layer 200, typically made of an oxide. In this regard, the growth of the crystallites 510A1-510A5 is done according to the pendeo-epitaxy principle.

It will be noted that it is particularly advantageous to etch the pads 1000A1-1000A5 after formation by epitaxy of the buffer layer 400 and of the priming layer 500 (when these layers are present). Indeed, if one of these layers 400, 500 was deposited after etching, it would be formed at least partially between the pads 1000A1-1000A5 on the upper face of the creep layer 200. In the case where the epitaxially grown nitride is GaN, that the creep layer 200 is $SiO_2$, thus, at the temperature of the deposition by epitaxy, the epitaxial growth of the continuous nitride layer 550A would not be done selectively, but would, on the contrary, also occur between the pads 1000A1-1000A5, which naturally is not desirable.

Particularly advantageously, the temperature $T_{epitaxy}$ at which the epitaxy is done is greater than or around the vitreous transition temperature $T_{vitreous\ transition}$ of the creep layer 200. Thus, during epitaxy, the creep sections 220A1-220A5 are brought to a temperature which enables them to be deformed.

Consequently, if the crystallites 510A11-510A12 carried by two adjacent pads 1000A1-1000A2 are disoriented against one another, during the coalescence of these two crystallites, the boundary formed at their interface, usually called grain boundary or coalescence boundary, will be formed without dislocation to catch these disorientations. The deformation of the creep sections 220 thus makes it possible to catch these disorientations and to obtain a continuous layer 550A without or with very few dislocations at the coalescence boundaries.

The maximum dimension $d_{layer}$ of a continuous layer measured parallel to the plane xy is noted. Thus, $d_{layer}$ corresponds to the maximum dimension of a projection of the continuous layer in a plane parallel to the plane xy. Preferably, $0.8\ \mu m \leq d_{layer} \leq 3\ \mu m$ and preferably $1\ \mu m \leq d_{layer} \leq 2\ \mu m$. $d_{layer}$ depends on the speed and on the duration of the epitaxial growth, as well as on the number and on the dimension of the pads.

The distances (for example, referenced $P_1$, $P_2$, $P_3$, $P_4$ . . . in the figures) separating two pads, the overlying crystallites of which are successively coalesced at the continuous layer are typically greater than 300 nm, and for example, between 300 nm and 10 μm, for example, between 300 nm and 5 μm. These distances can, in particular, be chosen according to the size of the component that is sought to be manufactured from the continuous layer formed at the end of the method. The increase of the distance between pads as it is considered that the index pads are higher and higher, is done typically more rapidly for a small component than for a large component. Indeed, for a large component, this could be found with pads which are far away from one another. Yet, it can be complex to achieve the coalescence of crystallites belonging to pads which are far away from one another, in particular due to an advanced stage of the method, the continuous layer is quite thick. It must be noted, however, that a significant thickness of the continuous layer can be sought in view of manufacturing certain devices, for example, for power electronics. It is therefore not excluded to achieve coalescences between crystallites and the continuous layer when the nitride thickness is significant (optionally up to several tens of micrometres).

The method for producing the continuous layer 550A can be stopped from FIG. 3H. Alternatively, this method can be continued to form a micro-LED from the continuous layer 550A.

According to a non-limiting embodiment not illustrated, quantum wells are made within the continuous layer 550A. This embodiment advantageously makes it possible to directly produce a micro-LED of size corresponding to the initial size of the continuous layer. To produce quantum wells within the continuous layer 550A, a person skilled in the art can implement the known solutions of the prior art. Thus, once the crystallites 510A1-510A5 have coalesced, the same growth conditions are adopted for the wells as during a conventional two-dimensional growth.

The smallest dimension possible for micro-LEDs is according to the ultimate resolution of the structuring methods chosen: for example, for pad arrays developed by nanoprinting, pad sizes of 50 nm and distances between pads of 100 to 150 nm are reached. Which means that, dimensions $d_{layer}$ of continuous layers of 1 to 2 μm are obtained. This is therefore around the pixel sizes sought for high-resolution μ-displays.

Explanation of the Principle of Coalescence without Dislocation or with Few Dislocation(s) within Continuous Layers As indicated above in reference to FIGS. 3E to 3H, the formation of the continuous layer 500A passes through the successive coalescences of isolated crystallites 510A1-510A5.

Figure 5A:
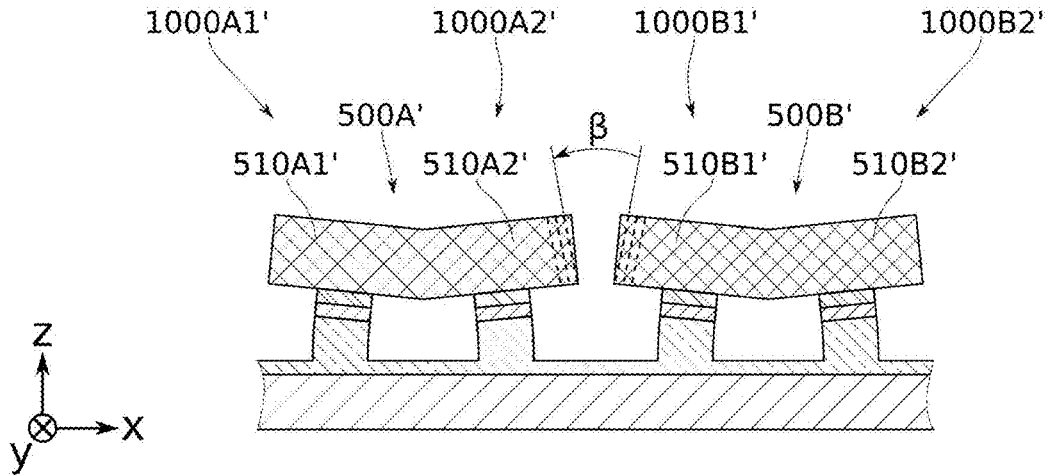
FIGS. 5A and 5B represent the coalescence of two continuous layers themselves formed beforehand by the coalescence of crystallites.
Figure 5B:
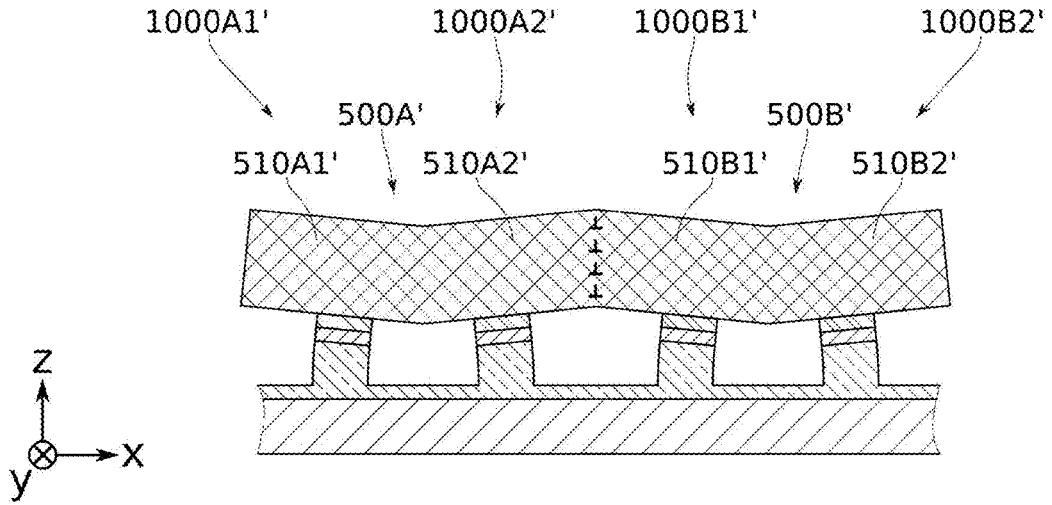

Such as illustrated in FIGS. 5A and 5B, the coalescence of assemblies of crystallites already coalesced induces defects at the coalescence boundaries.

FIGS. 5A and 5B illustrate the example of two continuous layers 500A', 500B' each having been obtained by coalescence of two crystallites (510A1' and 510A2' on the one hand, 510B1' and 510B2' on the other hand), each supported by a pad (1000A1' and 1000A2' on the one hand, 1000B1' and 1000B2' on the other hand). The crystalline planes of these two layers have an angular orientation defect marked by the angle β.

It could be expected that, like in the case of the coalescence of two isolated crystallites, this orientation defect is compensated for by the properties of the creep sections of each of the pads. It has however been noted that a compensation would not be made, or at the least, would be made in insufficient proportions to limit the coalescence defects satisfactorily.

This is explained by the following elements. During a first coalescence of a crystallite with a neighbouring crystallite, the underlying creep section is deformed according to the relative disorientations of these first two crystallites. Beyond this first coalescence, the creep section is therefore mechanically stressed in a direction dependent on these disorientations.

If another coalescence happens, two cases are thus distinguished:

a. The coalescence of the continuous layer is done with an isolated crystallite (a crystallite is qualified as an isolated or single crystallite not having yet coalesced with one or more other crystallites): the creep section underlying this isolated crystallite has a great mechanical freedom and can itself only compensate for the disorientations between the crystalline arrays of the continuous layer and of the isolated crystallite. It is understood that a deformation of the creep sections underlying the continuous layer is also possible, in a proportion which is smaller than the deformation of the creep section underlying the isolated crystallite.

b. The coalescence of the continuous layer is done with another continuous layer, also obtained by the coalescence of crystallites carried by several pads (case illustrated in FIG. 5B): the different creep sections are thus too stressed due to their mechanical dependency on the continuous layer and on the other creep sections. Their presence does not make it possible to compensate for the misalignments between the two continuous layers and these coalesce by causing numerous defects within the crystallites, in particular at the coalescence boundary. It is understood that the creep sections underlying the two continuous layers can be deformed, but in a measure which is too low to themselves only compensate for the disorientations of the continuous layers.

In other words, the creep sections of the pads 1000A1', 1000A2', 1000B1', 1000B2' supporting the crystallites 510A1', 510A2', 510B1', 510B2' involved in a coalescence between crystallites already coalesced have a mobility which is a lot lower than when each of them supports an isolated crystallite. It is this mobility difference which explains why the principle of coalescence of crystallites flooded by pendeo-epitaxy does not apply satisfactorily to a pad array in any relative arrangements.

FIGS. 5A and 5B illustrate the fact that an out-of-plane misalignment of the continuous layers 500A', 500B' is not compensated for by the presence of creep sections, but it is understood that the same observation can be made for an orientation defect in the plane xy.

As explained above, it has been noted that if an isolated crystallite is involved in the coalescence, its creep section itself only makes it possible to compensate for its misalignments with the continuous layer. Thus, the invention is proposed to dispose the pads on the surface of the substrate, such that only this situation is met during the progressive formation of the continuous layer, and that the coalescence of two continuous layers each coming from several crystallites is avoided. Thus, according to the invention, at one coalescence point, the progressive coalescence of the crystallites 510A1-510A5 is always done between, on the one hand, one single crystallite 510A1 or a plurality of coalesced crystallites 510A1-510A4 and on the other hand, an isolated crystallite 510A2-510A5. The formation of structural defects is thus avoided within the crystallites and therefore within the continuous layer during successive coalescences, which makes it possible to ultimately obtain a continuous layer of excellent quality.

As expressed above, this does not prevent at the assembly of pads, several coalescences occurring simultaneously. In this case, a plurality of crystallites having already coalesced beforehand can come into coalescence, simultaneously, with a plurality of crystallites isolated from one another, i.e. not having coalesced beforehand with no other crystallite.

It is understood that two crystallites forming part of the continuous layer formed by successive coalescences are considered as coalesced with one another, that they have been or not in direct contact with one another during the coalescence of one of them at the continuous layer. Generally, any crystallite of the continuous layer is considered coalesced at all the other crystallites forming the continuous layer, and this, from its integration by coalescence at the continuous layer. The continuous layer indeed forms a coalesced assembly within which the limits between crystallites cannot actually be defined, in particular as the epitaxy advances. Thus, the progressive coalescence of the crystallites which is controlled during the method according to the invention is intended as the succession of additions of one or more crystallites at the continuous layer. In particular, it can be fully considered that during the method according to the invention, two crystallites forming part of the continuous layer come into contact and coalesce again with one another, this time directly. These coalescences can be called internal coalescences. The internal coalescences are not considered for the progressive coalescence of the crystallites, since on the occasion of an internal coalescence, no crystallite is added to the continuous layer. As will be approached further, precautions in terms of arrangement of the pads can be taken so as to optimise these internal coalescences.

It must be noted that a variation of growth speed can occur during the method, due to the inevitable variations of the method (for example, due to the injection of precursors, due to the variation of temperature or of pressure, etc.). Thus, advantageously, it is provided that the variation of the distance between pads from a centre of symmetry of the coalescence makes it possible to compensate for this variation of coalescence speed for one same assembly of pads. In this way, even under the effect of a variation of the coalescence speed, the principle of forming the continuous layer by successive coalescences of isolated crystallites is verified.

Examples of Arrangement of Pads Enabling a Coalescence without Dislocation or with Few Dislocation(s) within the Continuous Layers Different examples of arrangement of pads on the substrate 100 making it possible to obtain a continuous layer having a low defect density will now be described in reference to FIGS. 4A to 4F.

It is understood that the arrangement of the pads is intended as their distribution in the space projecting into the plane xy, and quite specifically, projecting over the upper face 101 of the substrate 100.

The distance between two neighbouring pads is measured from one edge of one of these two pads to the other edge of these two pads, projecting into the plane xy, as illustrated in FIG. 3C.

Figure 4A:
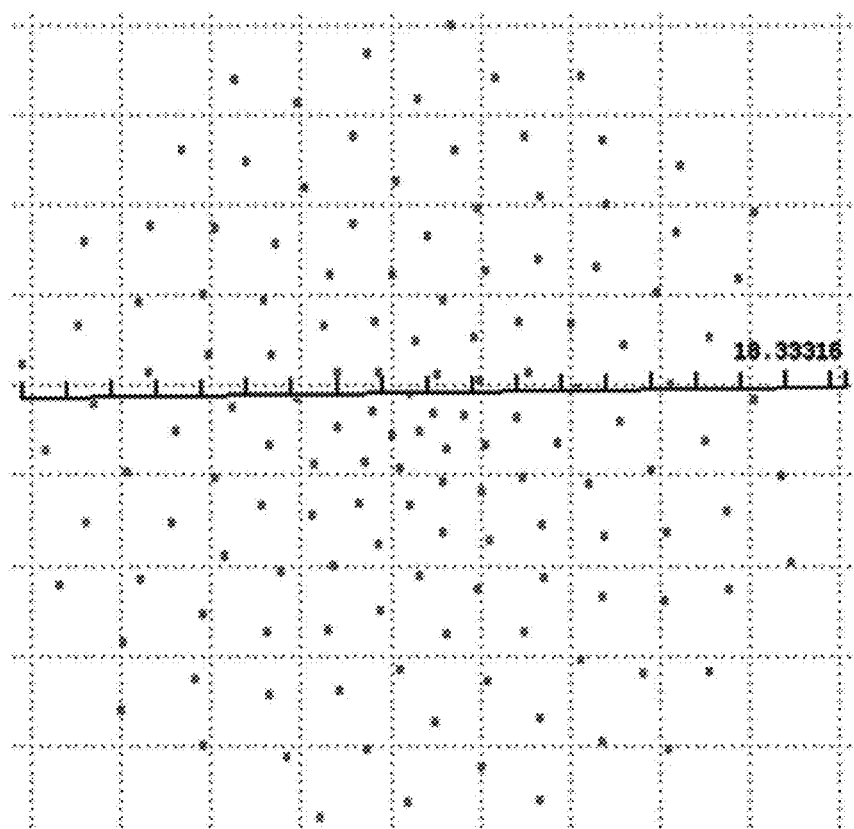
FIGS. 4A to 4F illustrates examples of arrangements of pads enabling the manufacture of continuous layers having a low defect density.
Figure 4B:
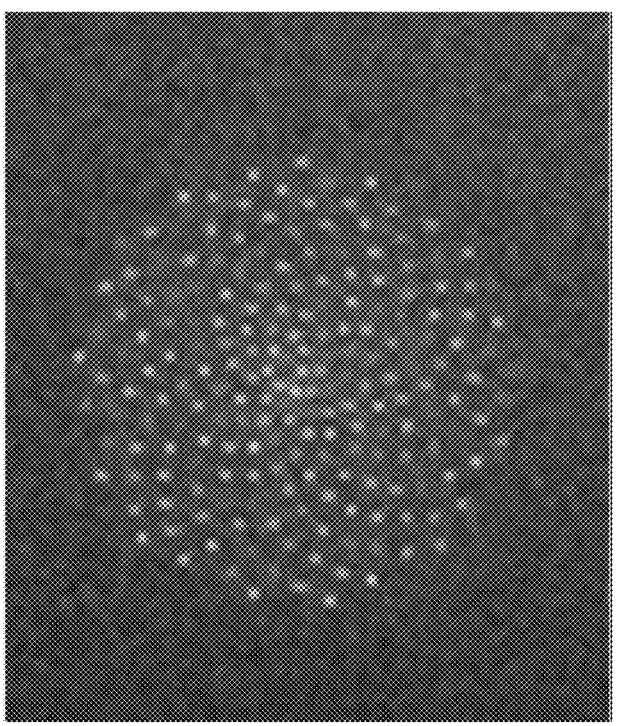

A first example of arrangement of the pads 1000A1-1000A5 on the substrate 100 is illustrated in FIGS. 4A and 4B. In this example, the pads 1000A1-1000A5 are disposed along a logarithmic spiral. Such a spiral is a curve, the polar equation of which is of the form r=ab$^\theta$, with a and b real positives and r the radius measured between the centre of the spiral and the point of the curve forming an angle θ with an axis of origin, in this case, arbitrary from the horizontal plane XY. Advantageously, therefore, the pads 1000A1-1000A5 are disposed on a theoretical curve of this form. The distribution of the pads 1000A1-1000A5 on this theoretical curve is, in particular, chosen according to the control level of the methods in play, quite specifically of the epitaxy method, and of their variability. The better the control is, the more the space between the two consecutive pads on the curve can slightly increase, as the curve is travelled from the origin.

FIG. 4A illustrates a theoretical arrangement according to such a model, while FIG. 4B is an SEM photograph as a top view of pads disposed according to this embodiment.

This embodiment is particularly advantageous, as it enables a high density of pads on the surface of the substrate, which leads to a rapid coalescence of crystallites. Indeed, at identical parameters of epitaxial growth, the greater the density of pads is, the greater the coalescence speed is. The density of pads on the surface of the substrate is defined, projecting into the horizontal plane XY like the ratio between the surface occupied by the pads on the upper face 101 of the substrate 100 and the surface of this upper face 101 of the substrate 100.

Figure 4C:
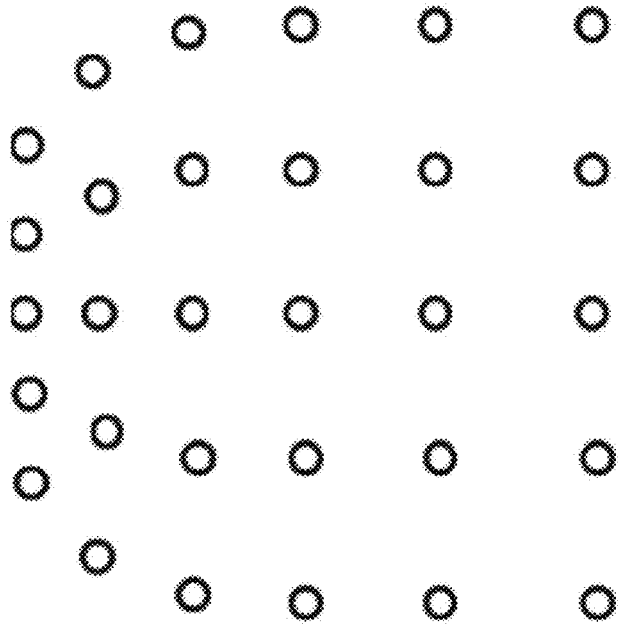
Figure 4D:
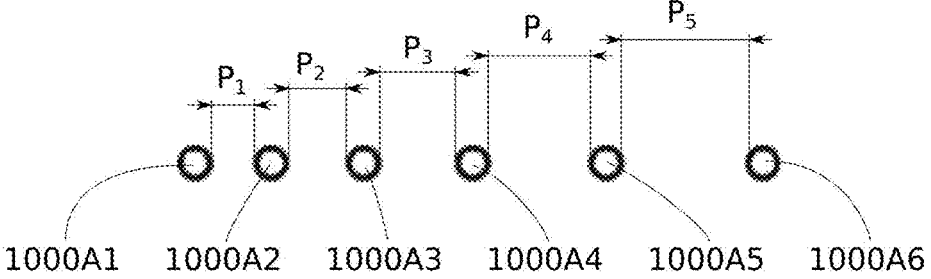

According to another embodiment illustrated in FIG. 4D, the pads are aligned along one single axis, called axis of alignment. A direction of alignment is defined from this axis of alignment, as well as an initial point positioned on this same axis. A first post 1000A1 is located on this axis of alignment, for example, on the initial point. The other pads are located also on this axis of alignment, and the distance separating two consecutive pads 1000A1-1000A6 increases when the axis of alignment is travelled in the direction of alignment. By noting $P_1$, $P_2$, $P_3$, $P_4$ and $P_5$ of the distances respectively separating the first 1000A1 and the second 1000A2 pads, the second 1000A2 and the third 1000A3 pads, the third 1000A3 and the fourth 1000A4 pads, the fourth 1000A4 and the fifth 1000A5 pads and finally the fifth 1000A5 and the sixth 1000A6 pads, the order of the pads being given along the direction of alignment, the following is thus had: $P_1 < P_2 < P_3 < P_4 < P_5$. By noting i the index of the pad on the axis of alignment, with i going from 1 to N, N being the number of pads disposed along the axis of alignment, the following is preferably had, for i≥2, $P_i > 1,1 * P_{i-1}$. Advantageously, the distance between pads develops, on the axis of alignment and along the direction of alignment, according to a geometric continuation: for i≥1, $P_i = aq^i$, a and q being real positives, with preferably 2≤q and/or q≥1.1.

This embodiment can be qualified as an "in line" arrangement.

According to another embodiment illustrated in FIG. 4C, some of the pads are disposed along axes of alignment, such as defined above in reference to FIG. 4D. These axes of alignment are parallel to one another. In order to enable a good priming of the coalescence at the start of the method, it is also provided that other pads are not necessarily aligned on one of the axes of alignment.

The pads can, for example, be disposed along axes parallel to one another and perpendicular to the axes of alignment mentioned above. These axes are called secondary axes of alignment. The pads disposed on one same secondary axis of alignment are preferably disposed along a constant pitch. Moreover, by considering all of the secondary axes of alignment in the direction parallel to all the axes of alignment and along the same direction of alignment as these axes, the pitch between pads aligned on one same secondary axis of alignment increases. In this example, care is taken that the distance separating two successive axes of alignment (also being able to be seen as the pitch between the pads on the secondary axes of alignment) is always greater than the pitch between pads aligned along the axes of alignment. It is this example which is illustrated in FIG. 4C.

Figure 4E:
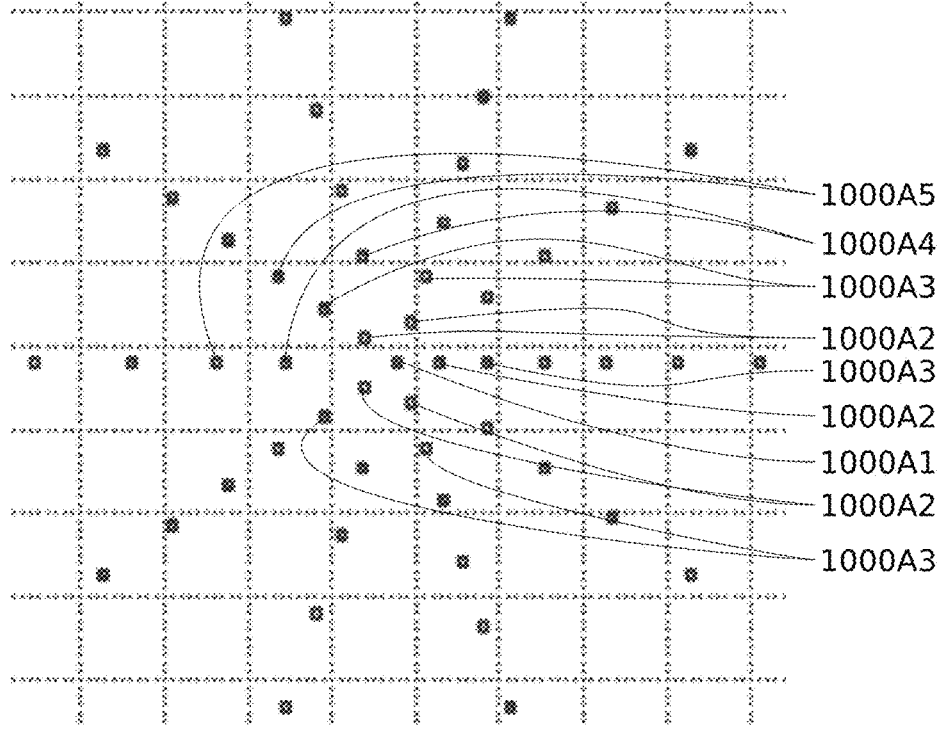
Figure 4F:
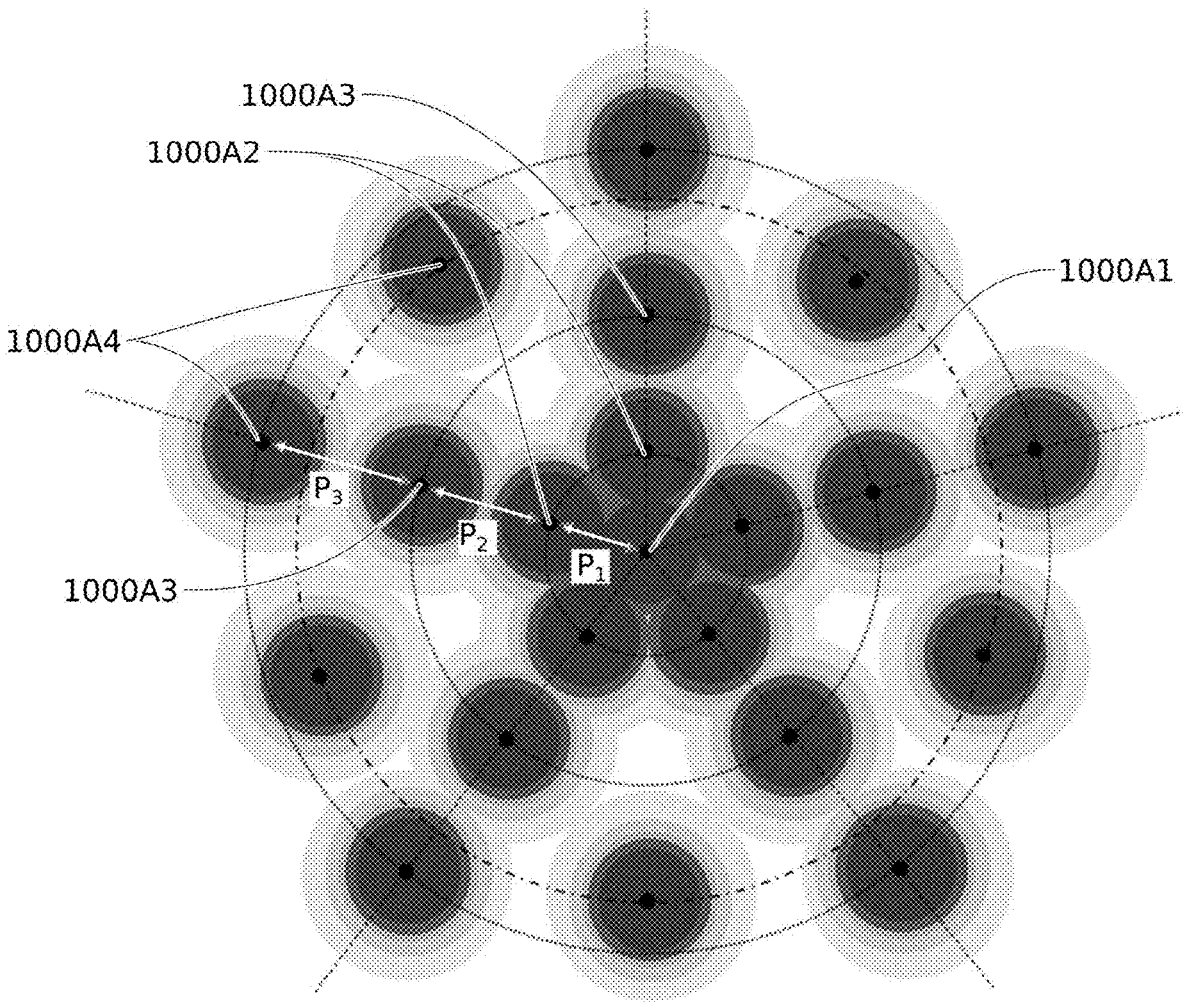

According to an embodiment illustrated in FIGS. 4E and 4F, the pads are disposed along a plurality of concurrent axes of alignment, for example, five as is represented. A central point can be defined, at the level of which a pad is located or not, corresponding to the point of concurrency of these axes of alignment. The pads are thus distributed over branches each starting from the central point.

Advantageously, and as is highlighted in FIG. 4F, the pads are distributed on concentric circles.

On each of the branches, the pads can be disposed as has been described for one single axis of alignment, the initial point of the axis of alignment such as defined in the preceding embodiment, thus being the point of concurrency of the axes of alignment defined, in this case.

This embodiment can be qualified as a "star" arrangement.

FIG. 4F highlights the order of coalescence of the crystallites in an example of this embodiment. It is a top view of an assembly of pads at different stages of advancement of epitaxial growth of the crystallites. The pads are represented by black dots. The different concentric discs around one same pad correspond to different states of advancement of the growth of the crystallite supported by said pad. More precisely, a disc corresponds to a stage of advancement of the growth to which a coalescence (or several simultaneous coalescences) occur(s). This figure considers internal coalescences such as defined above.

In this example, a first pad 1000A1 is located at the central point of the assembly of pads and five second pads 1000A2 are located on a first circle having, as the centre, the central point of the assembly of pads. A first growth phase occurs and ends by the coalescence of the first pad 1000A1 with the five second pads 1000A2 (these five coalescences occurring substantially simultaneously). This coalescence makes it possible to form a continuous layer.

It must be noted that during the first growth phase, the distance between the second pads 1000A2 and the third pads 1000A3 (and, more generally, any other alternative higher pad) is sufficiently large such that their respective crystallites do not coalesce at this stage of the method (i.e. $P_2 > P_1$). This enables that the crystallites supported by the second pads 1000A2 are isolated crystallites during their coalescence with the first pad 1000A1.

During a second growth phase, all of the crystallites continue to grow, and this, until coalescence of the continuous layer with the crystallites carried by third pads 1000A3 (in this case, five of them). It must be noted again that during the second growth phase, the distance between the third pads
1000A3 and the fourth pads 1000A4 (and, more generally,
any other alternative higher pad) is sufficiently large such
that their respective crystallites do not coalesce at this stage
of the method (i.e. $P_3 > P_2$). This enables that the crystallites
supported by the third pads 1000A3 are isolated crystallites
during their coalescence with the continuous layer.

The same observations can then be made for the coales-
cence, on the one hand, of third pads 1000A3 and on the
other hand, fourth pads 1000A4, respectively during a third
and a fourth growth phase.

It is understood that the different epitaxial growth phases
take place typically continuously and that they are, in this
case, represented and described separately for explanatory
purposes only. In particular, the concentric circles are only
schematic representations of the advancement of the growth
at different instants of the method, but have no physical
reality at the end of the method.

The different examples of arrangement of the pads
1000A1-1000A5 on the substrate 100 described above have
made it possible to obtain continuous layers of very good
quality, greatly reducing the defect density with respect to
layers obtained without precautions on the arrangement of
the pads. In particular, the symmetry of rotation allowed by
the distribution of the pads around the first pad 1000A1
makes it possible to limit, even remove the potential defects
caused by the internal coalescences in the continuous layer.
It also makes it possible to facilitate the manufacturing of the
pads.

It is understood, however, that any arrangement of the
pads enabling the formation of a continuous layer only by
additions of isolated crystallites to a cluster of crystallites (or
optionally, at the start of the method, to another isolated
crystallite) makes it possible to obtain results just as satis-
factory. It can, for example, be considered to remove the
central pad.

Figure 6A:
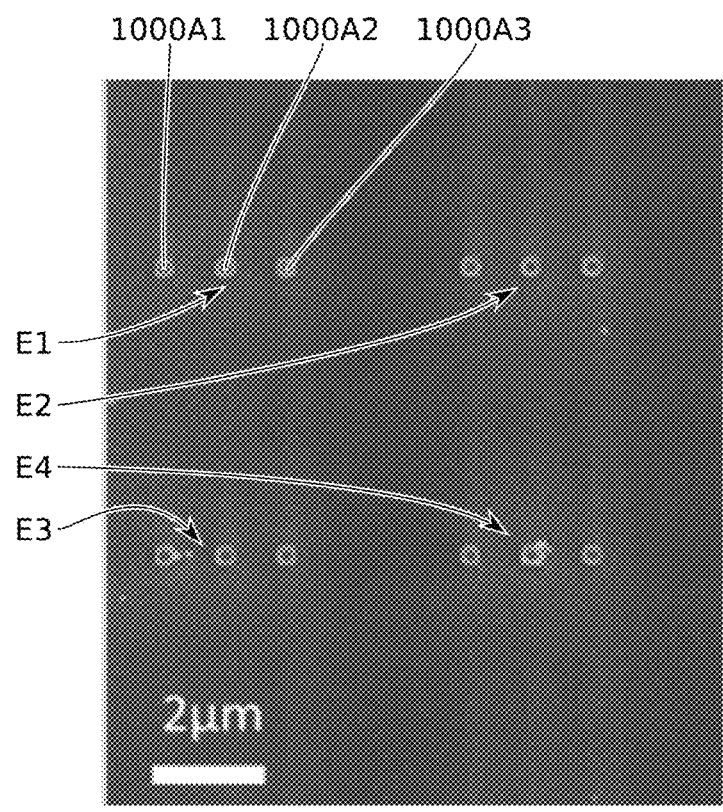
FIG. 6A is an SEM image of four assemblies, each formed of three silicon (creep section) and GaN (crystalline section surmounting the creep section) pads, it all being carried by a silicon on insulator (SOI) substrate.
Figure 6B:
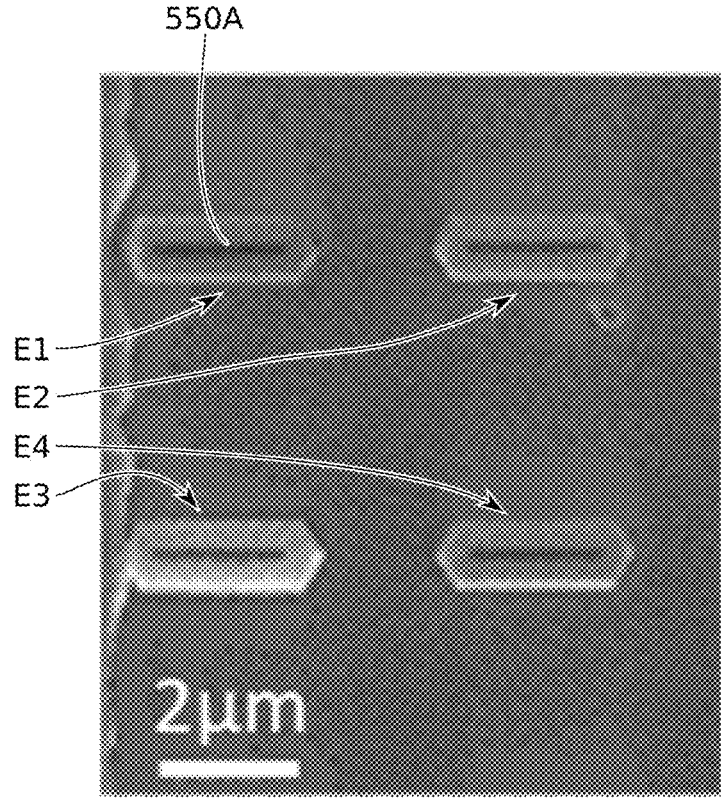
FIG. 6B is an SEM image of assemblies illustrated in FIG. 6A after coalescence of the pads of one same assembly.

FIGS. 6A, 6B, 7, 8A and 8B are experimental results
obtained by implementation of the method according to the
invention such as described above. FIG. 6A is a top view of
four assemblies E1, E2, E3 E4 of each of the three pads
1000A1, 1000A2, 1000A3 each having a silicon creep
section surmounted by a GaN crystalline section. These pads
are carried by an SOI substrate. Within an assembly E1, E2,
E3 E4, the pads are disposed along an axis of alignment, like
in the embodiment described above and schematised in FIG.
4D. An epitaxial growth has been done from these pads, until
coalescence of the three pads of each assembly. The result
obtained is presented in FIG. 6B. Each assembly of pads E1,
E2, E3 E4 has made it possible to form a continuous GaN
layer 550A.

Figure 7:
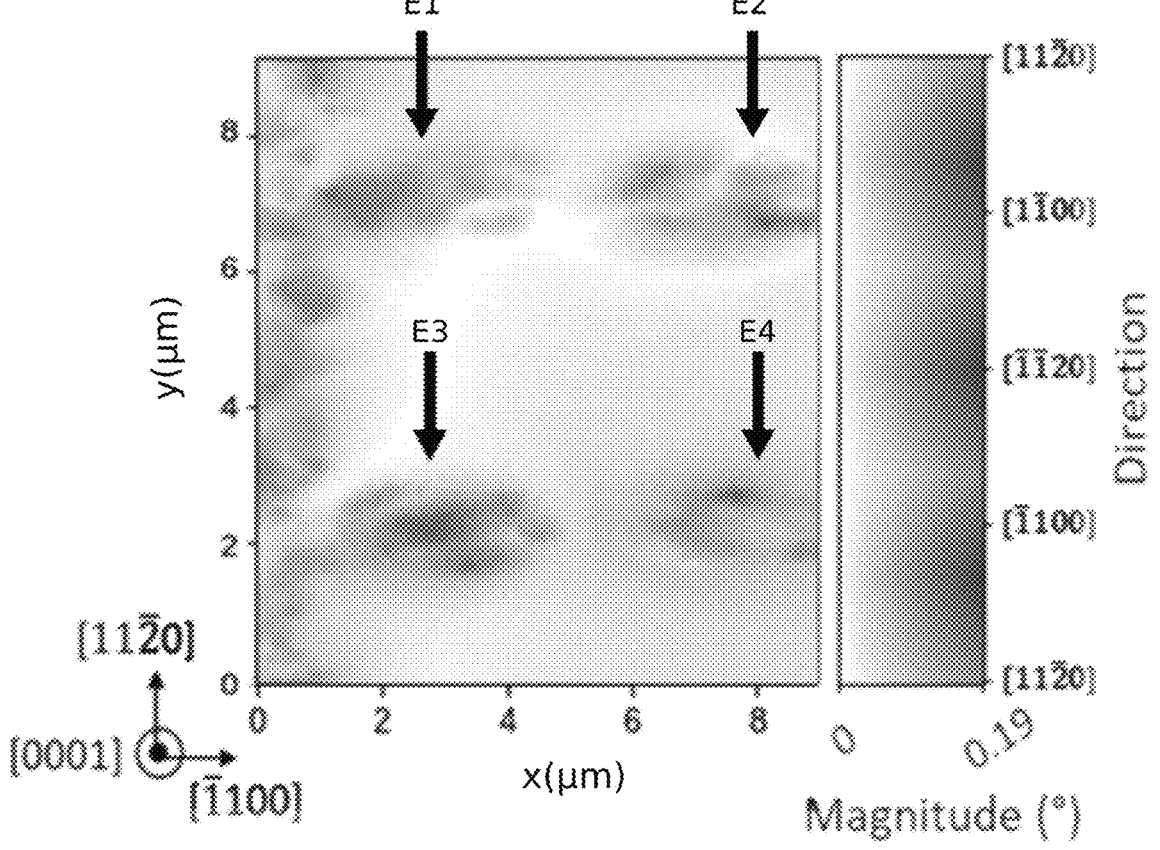
FIG. 7 illustrates results obtained by X-ray diffraction analysis illustrating the orientation of the GaN layers obtained by coalescence of the pads.
Figure 8A:
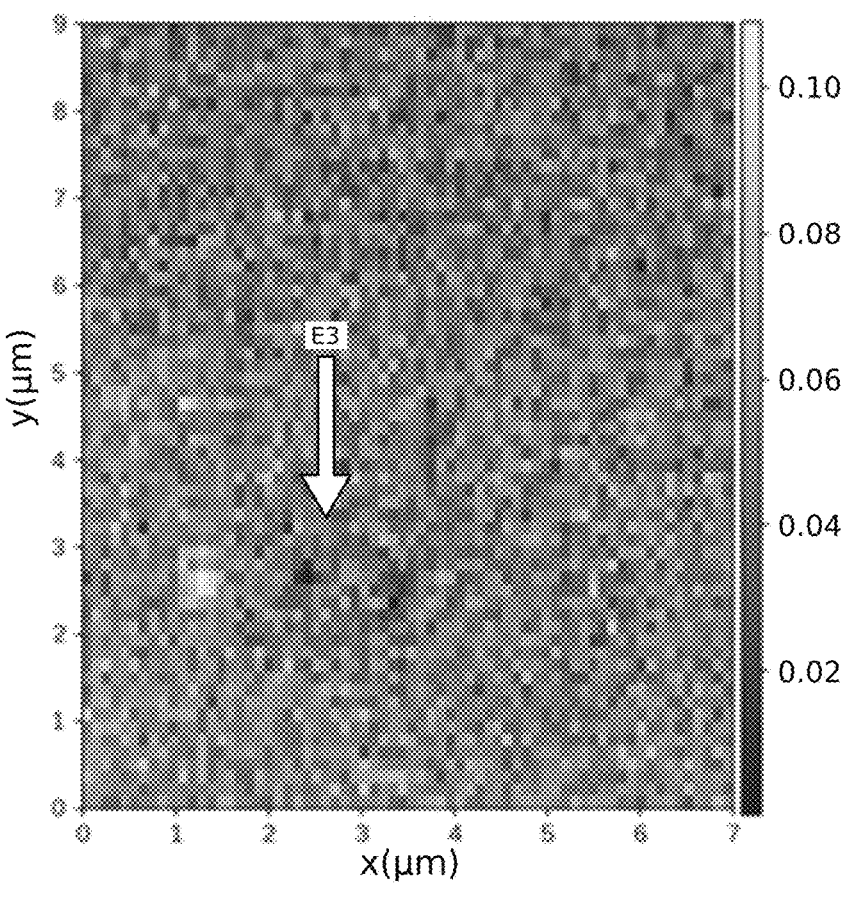
FIGS. 8A and 8B illustrate results obtained by X-ray diffraction analysis illustrating the orientation of the silicon sections after coalescence of the pads.
Figure 8B:
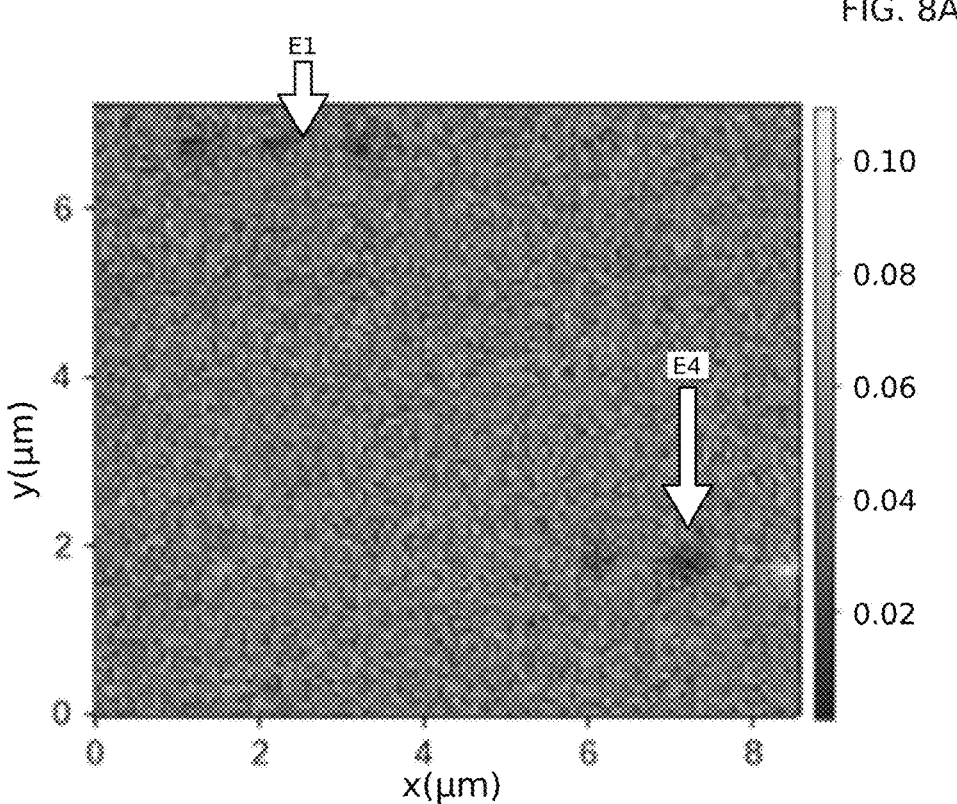

FIGS. 7, 8A and 8B are results obtained by X-ray dif-
fraction analysis of the assembly.

FIG. 7 shows the orientation of the continuous GaN layers
obtained after coalescence. It is observed that the assemblies
E3 and E4, in particular, have enabled the formation of
continuous layers having a very uniform orientation.

FIGS. 8A and 8B show the orientation of the silicon
sections of the pads after coalescence. It is observed that the
silicon sections of the assembly E1 have preserved a very
similar orientation between the start and the end of the
method. The silicon sections of the assemblies E3 and E4,
for their part, are oriented differently. The sections are thus
deformed to make the formation of a continuous GaN layer
very aligned.

These figures thus illustrate the fact that the alignment of
the continuous GaN layers by deformation of the creep
sections during the method operates as hoped.

The non-limiting example described above makes refer-
ence to the use of the nitride layer to form an LED or a
micro-LED. As indicated above, this example is not limit-
ing. The method described could just as well serve for the
production of another nitride-based device, for example,
vertical devices such as HEMT transistors.

The invention is not limited to the embodiments described
above, and extends to all the embodiments covered by the
invention.

The invention claimed is:

1. A method for obtaining a continuous nitride layer, at
least partially made of a nitride, the method comprising:
 providing a stack comprising at least one assembly of
  pads extending from a substrate, each pad comprising
  at least:
  a creep section, formed in an amorphous material
   having a vitreous transition temperature
   $T_{vitreous\ transition}$; and
  a crystalline section, surmounting the creep section;
   and
 epitaxially growing a crystallite on at least some of said
  pads and continuing the epitaxial growth of the crys-
  tallites until coalescence of the crystallites carried by
  the pads of the assembly of pads, so as to form the
  continuous nitride layer,
 wherein the pads of said assembly of pads are distributed
  over the substrate such that a relative arrangement of
  the pads of the assembly of pads is such that during the
  epitaxy of the crystallites, the coalescence of the crys-
  tallites is always done between, on the one hand, a
  coalesced assembly comprising a crystallite or a plu-
  rality of coalesced crystallites and, on the other hand, at
  least one isolated crystallite, not having already
  coalesced with other crystallites.

2. The method according to claim 1, wherein the pads
carrying the crystallites forming the continuous nitride layer
are substantially disposed, projecting into a horizontal plane
into which an upper face of the substrate mainly extends,
along a logarithmic spiral.

3. The method according to claim 1, wherein the pads
carrying the crystallites forming the continuous nitride layer
are, projecting into a horizontal plane into which an upper
face of the substrate mainly extends, substantially aligned
along at least one axis of alignment.

4. The method according to claim 3, wherein the pads
disposed on one same axis of alignment are spaced apart by
an increasing distance by travelling the axis of alignment
along a given direction from an initial point.

5. The method according to claim 4, wherein the pads
carrying the crystallites forming the continuous layer are
separated by a distance varying logarithmically step by step,
said distance being measured along their axis of alignment.

6. The method according to claim 1, wherein the pads
carrying the crystallites forming the continuous nitride layer
are substantially aligned, projecting into a horizontal plane
into which an upper face of the substrate mainly extends,
along concurrent axes, the concurrent axes verifying
between them, a symmetry of rotation around a central
point, projecting into the horizontal plane.

7. The method according to claim 6, wherein the pads are
aligned along five concurrent axes.

8. The method according to claim 1, wherein the epitaxial
growth is done at a temperature $T_{epitaxy}$, such that
$T_{epitaxy} > k_1 \times T_{vitreous\ transition}$, with $k_1 \geq 0.8$.

9. The method according to claim 8, wherein $k_1 \geq 1$.

10. The method according to claim 9, wherein $k_1 \geq 1.5$.

11. The method according to claim 1, wherein the assembly of pads comprises at least 3 pads.

12. The method according to claim 1, wherein the stack comprises a plurality of assemblies of pads on the substrate, a continuous nitride layer being formed from each assembly of pads, the epitaxial growth of crystallites being interrupted before the crystallites belonging to two distinct assemblies of pads come into coalescence, such that the continuous layers formed from each assembly of pads are distant from one another.

13. The method according to claim 1, wherein each pad has an upper face and wherein the epitaxial growth of the crystallites is done at least partially from said upper face.

14. The method according to claim 13, wherein the epitaxial growth of the crystallites is done only from said upper face.

15. The method according to claim 1, wherein the pads of said assembly of pads are distributed over the substrate such that the relative arrangement of the pads of the assembly of pads is such that during the epitaxy of the crystallites, at least at certain instants, the coalescence of the crystallites is done between, on the one hand, said coalesced assembly and, on the other hand, several isolated crystallites.

\* \* \* \* \*